US012672278B2

(12) United States Patent
Choi et al.

(10) Patent No.: US 12,672,278 B2
(45) Date of Patent: Jun. 30, 2026

(54) SEMICONDUCTOR DEVICE AND METHOD OF FABRICATING THE SAME

(71) Applicant: Samsung Electronics Co., Ltd., Suwon-si (KR)

(72) Inventors: Dongmin Choi, Suwon-si (KR); Hyo-Sub Kim, Suwon-si (KR); Sangkyu Sun, Suwon-si (KR); Junhyeok Ahn, Suwon-si (KR); Jay-Bok Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 312 days.

(21) Appl. No.: 18/541,559

(22) Filed: Dec. 15, 2023

(65) Prior Publication Data

US 2024/0357803 A1      Oct. 24, 2024

(30) Foreign Application Priority Data

Apr. 20, 2023      (KR) ........................ 10-2023-0052064

(51) Int. Cl.
*H10B 12/00*      (2023.01)
(52) U.S. Cl.
CPC ......... *H10B 12/50* (2023.02); *H10B 12/0335* (2023.02); *H10B 12/482* (2023.02)
(58) Field of Classification Search
CPC .................................................. H10B 12/482
See application file for complete search history.

(56) References Cited

U.S. PATENT DOCUMENTS

| | | | |
|---|---|---|---|
| 9,018,708 B2 | 4/2015 | Eun | |
| 9,184,168 B2 | 11/2015 | Ryu et al. | |
| 9,899,487 B2 | 2/2018 | Lee et al. | |
| 9,941,285 B2 | 4/2018 | Chun et al. | |
| 9,985,035 B1 * | 5/2018 | Feng ...................... | H10B 12/09 |
| 10,269,808 B2 | 4/2019 | Kim et al. | |
| 10,886,277 B2 | 1/2021 | Hong et al. | |
| 11,545,494 B2 | 1/2023 | Ji et al. | |
| 2014/0061806 A1 * | 3/2014 | Eun ...................... | H10B 12/482 |
| | | | 257/368 |
| 2019/0139963 A1 * | 5/2019 | Hong ...................... | H10B 12/34 |
| 2021/0035984 A1 * | 2/2021 | Ji ...................... | H10B 12/0335 |
| 2021/0074578 A1 * | 3/2021 | Chou ................... | H10W 20/072 |
| 2022/0139921 A1 * | 5/2022 | Kim ................... | H10B 12/0335 |
| 2023/0156999 A1 * | 5/2023 | Hsu ...................... | H10B 12/315 |
| | | | 438/253 |
| 2024/0179892 A1 * | 5/2024 | Jung ...................... | H10B 12/50 |
| 2024/0334681 A1 * | 10/2024 | Jung ...................... | H10B 12/50 |

FOREIGN PATENT DOCUMENTS

KR      10-2471620 B1      11/2022

* cited by examiner

*Primary Examiner* — Lauren R Bell
(74) *Attorney, Agent, or Firm* — Harness, Dickey & Pierce, P.L.C.

(57) ABSTRACT

A semiconductor device may include a substrate including a cell block region and a peripheral region, which are adjacent to each other in a first direction, an active pattern on the cell block region, a bit line provided on the active pattern and extended in the first direction, a first insulating structure in contact with the bit line, and a contact plug electrically connected to the bit line. The bit line may include a first curved portion, a first linear portion connected to the first curved portion, and a first intervening portion connected to the first curved portion. The contact plug may be overlapped with the first curved portion.

20 Claims, 38 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2023-0052064, filed on Apr. 20, 2023, in the Korean Intellectual Property Office, the entire contents of which are hereby incorporated by reference.

BACKGROUND

Various example embodiments relate to a semiconductor device, and in particular, a semiconductor device and/or a method of fabricating the same.

Due to their small-sized, multifunctional, and/or low-cost characteristics, semiconductor devices are being esteemed as important elements in the electronics industry. The semiconductor devices may be classified into a memory device for storing data, a logic device for processing data, and a hybrid device including both of memory and logic elements.

Due to the recent increasing demand or expectation for electronic devices with a fast speed and/or low power consumption, the semiconductor device requires or uses a fast operating speed and/or a low operating voltage. To meet or at least partly meet such expectations, the integration density of semiconductor devices is being increased, and many research studies are being conducted.

SUMMARY

Various example embodiments may provide a semiconductor device with an increased integration density and/or a method of fabricating the same.

Alternatively or additionally, various example embodiments may provide a semiconductor device with improved electrical and/or reliability characteristics.

According to some example embodiments, a semiconductor device may include a substrate including a cell block region and a peripheral region, which are adjacent to each other in a first direction, an active pattern on the cell block region, a bit line on the active pattern and extending in the first direction, a first insulating structure in contact with the bit line, and a contact plug electrically connected to the bit line. The bit line may include a first curved portion, a first linear portion connected to the first curved portion, and a first intervening portion connected to the first curved portion. The contact plug may overlap with the first curved portion.

Alternatively or additionally according to various example embodiments, a semiconductor device may include a substrate including a cell block region and a peripheral region, which are adjacent to each other in a first direction, an active pattern on the cell block region, a bit line on the active pattern and extending in the first direction, a first insulating structure in contact with the bit line, and a contact plug electrically connected to the bit line. A top surface of the bit line may be coplanar with a top surface of the first insulating structure.

Alternatively or additionally according to various example embodiments, a semiconductor device may include a substrate including a cell block region and a peripheral region, which are adjacent to each other in a first direction, an active pattern on the cell block region, a bit line on the active pattern and extending in the first direction, an insulating structure in contact with the bit line, a contact plug electrically connected to the bit line, an outer spacer on an outer side surface of the bit line, and an inner spacer on an inner side surface of the bit line. A top surface of the bit line may be coplanar with a top surface of the insulating structure, and the insulating structure may be interposed between the outer spacer and the inner spacer.

DETAILED DESCRIPTION

Various example embodiments will now be described more fully with reference to the accompanying drawings, in which example embodiments are shown.

Figure 1:
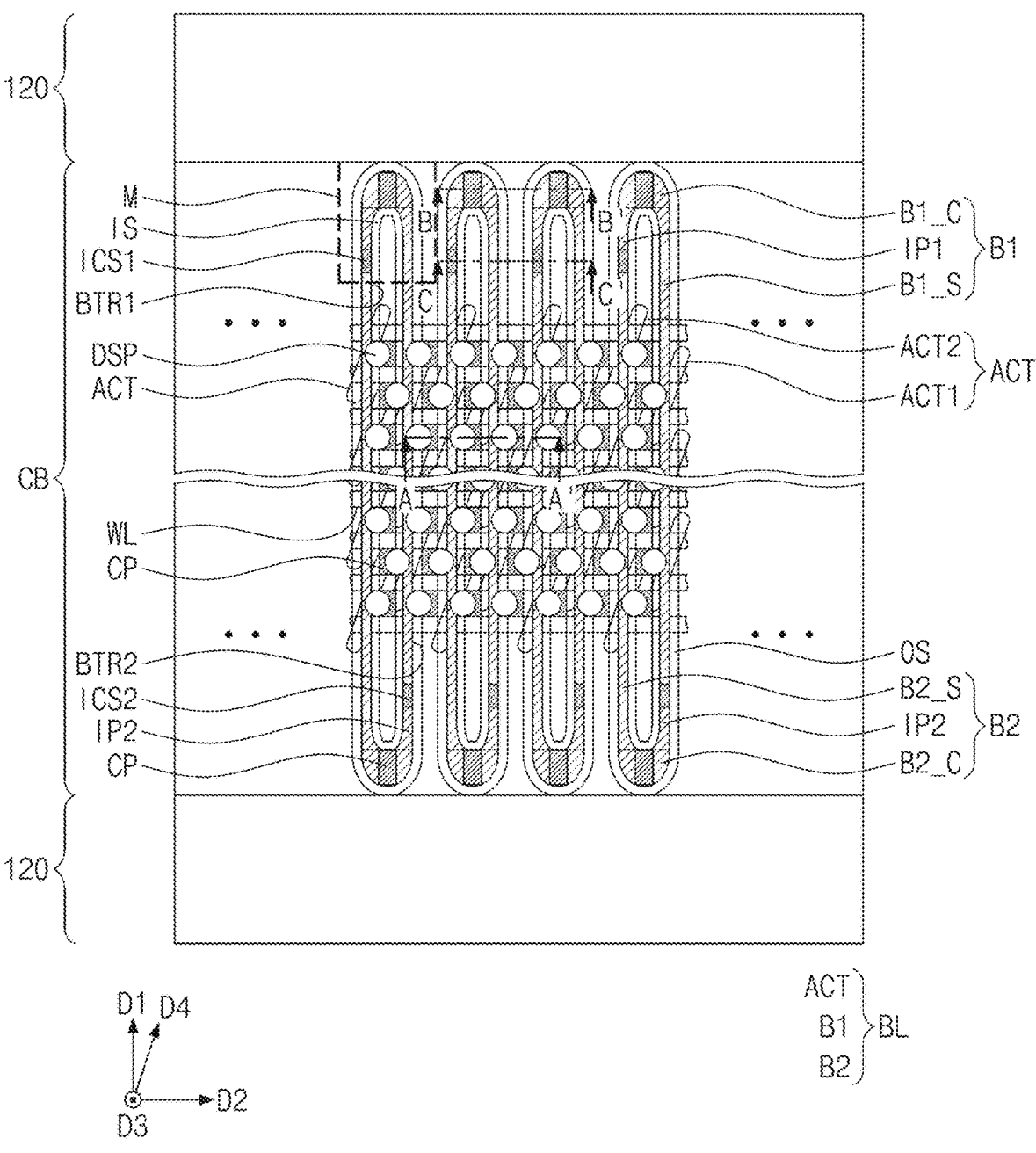
FIG. 1 is a plan view illustrating a semiconductor device, according to some example embodiments.
Figure 2:
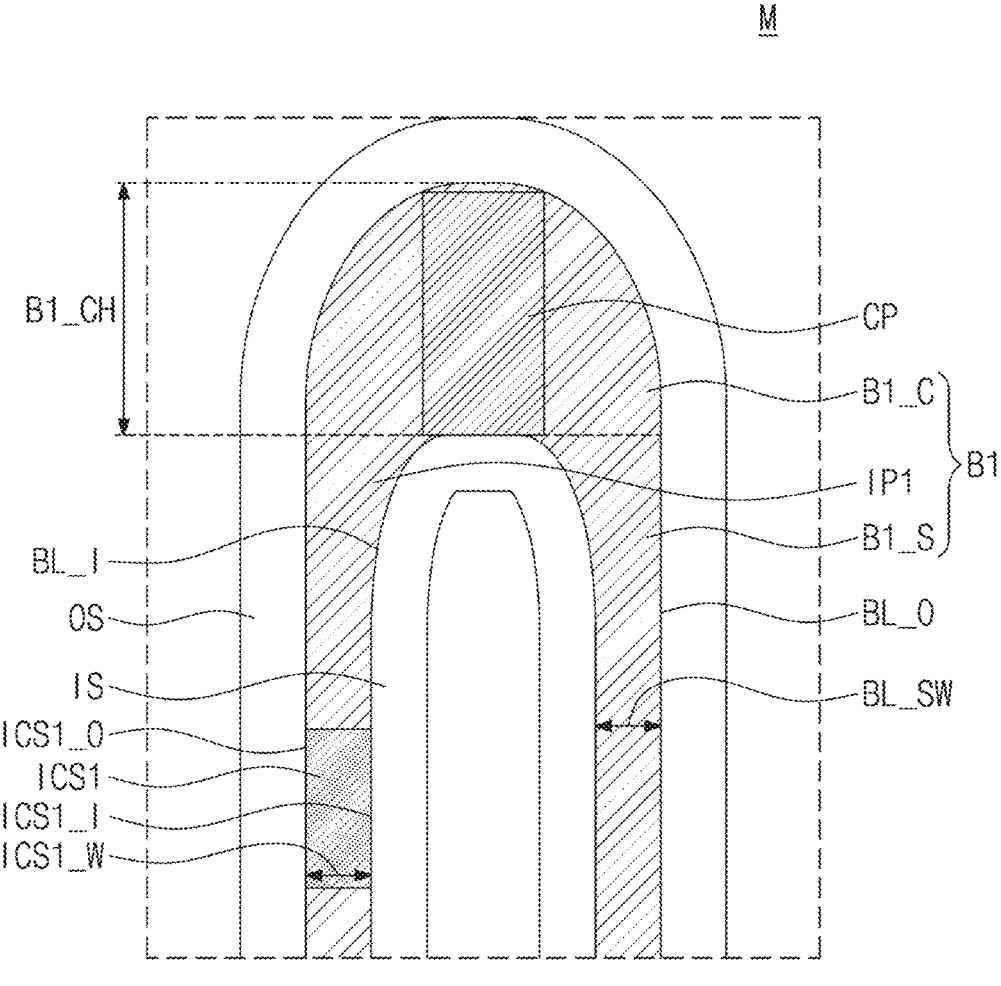
FIG. 2 is an enlarged plan view illustrating a portion 'M' of FIG. 1.
Figure 3:
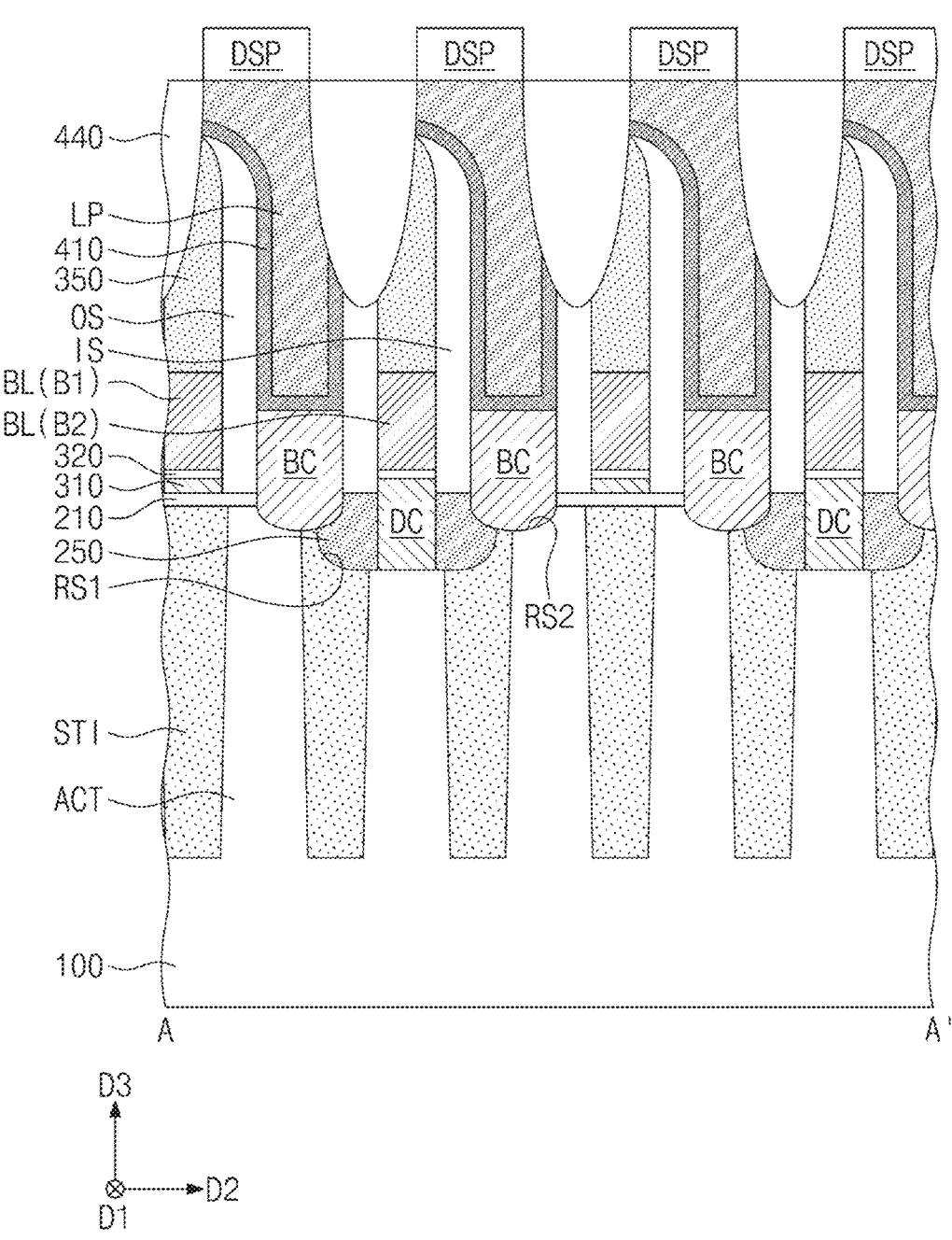
FIG. 3 is a sectional view corresponding to a line A-A' of FIG. 2.
Figure 4:
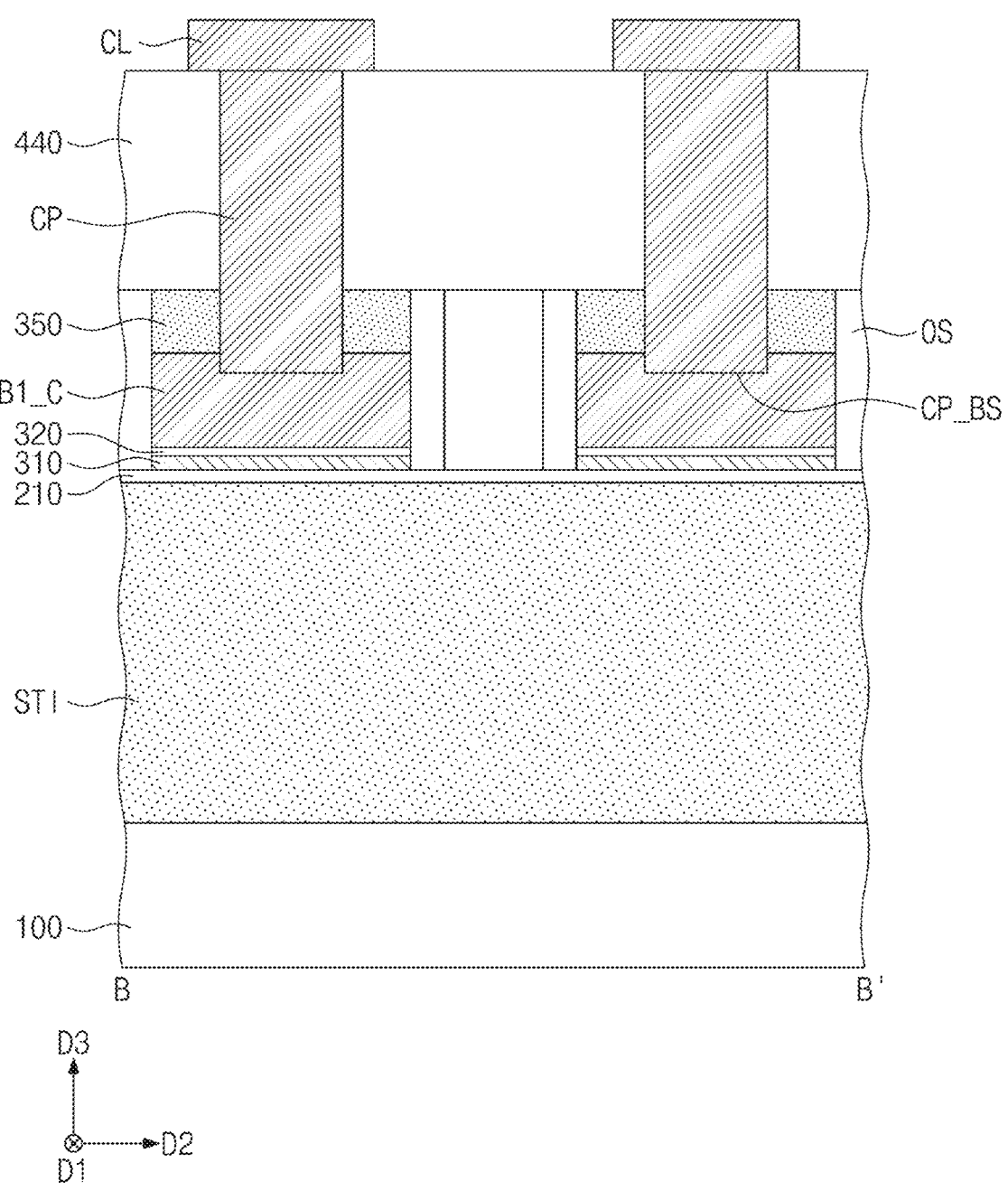
FIG. 4 is a sectional view corresponding to a line B-B' of FIG. 2.
Figure 5:
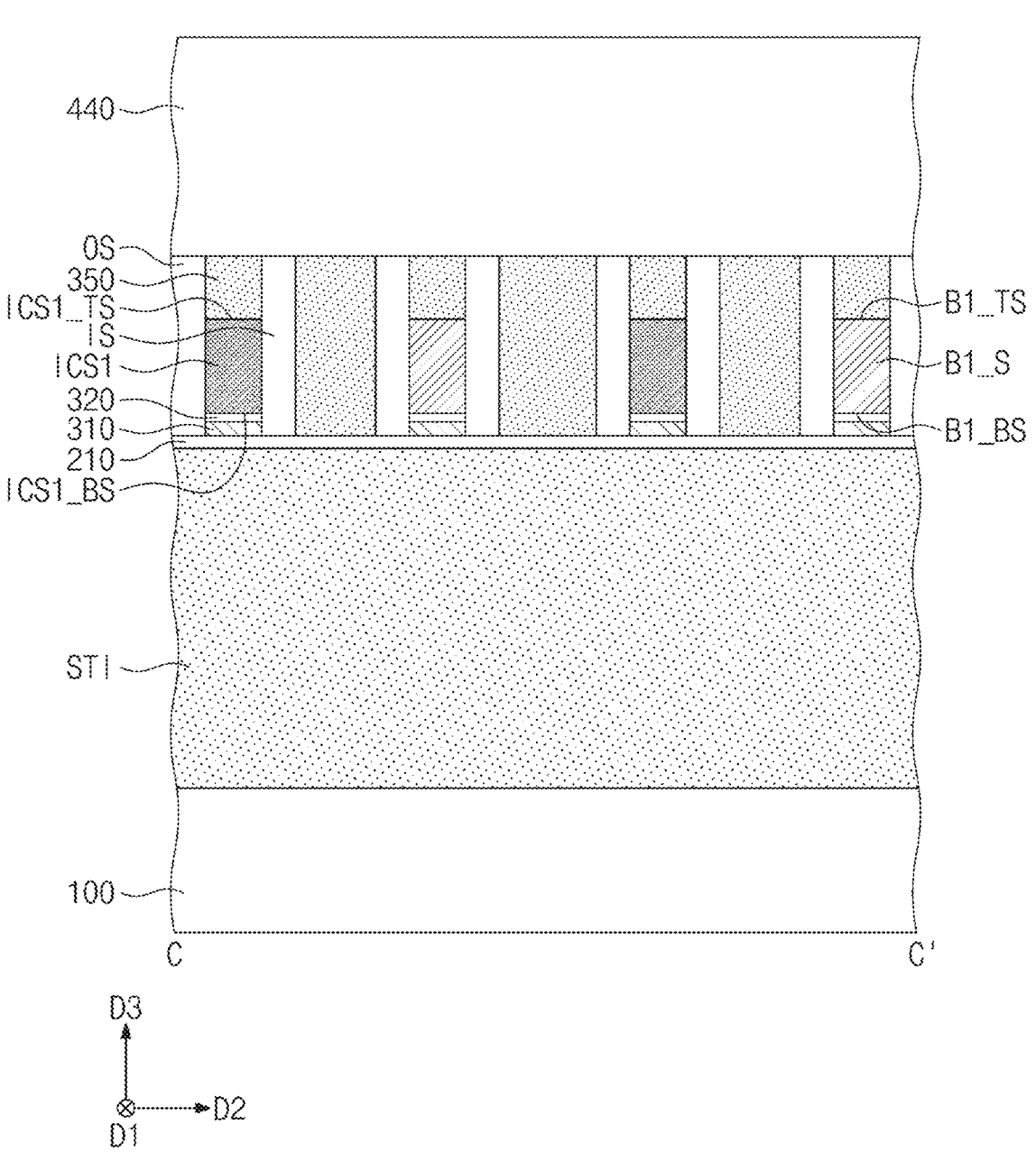
FIG. 5 is a sectional view corresponding to a line C-C' of FIG. 2.

FIG. 1 is a plan view illustrating a semiconductor device, according to some example embodiments of inventive concepts. FIG. 2 is an enlarged plan view illustrating a portion 'M' of FIG. 1. FIG. 3 is a sectional view corresponding to a line A-A' of FIG. 2. FIG. 4 is a sectional view corresponding to a line B-B' of FIG. 2. FIG. 5 is a sectional view corresponding to a line C-C' of FIG. 2.

Referring to FIGS. 1 to 5, a substrate 100 may be provided. The substrate 100 may be one of semiconductor substrates (e.g., a silicon wafer, a germanium wafer, or a silicon-germanium wafer). Alternatively in some example embodiments, the substrate 100 may be or may correspond to a singulated chip that has bene cut or diced from a wafer. The substrate 100 may include a cell block region CB and a peripheral region 120, which are adjacent to each other in a first direction D1. The cell block region CB and the peripheral region 120 may be arranged in the first direction D1. In some example embodiments, as shown in FIG. 1, the cell block region CB may be disposed between a pair of the peripheral regions 120, which are respectively disposed at opposite end portions in the first direction D1. The peripheral region 120 may include a scribe lane region, a peripheral circuit region, and/or a core region; example embodiments are not limited thereto, however, and the peripheral region 120 may not include a scribe lane region in some example embodiments.

A device isolation pattern STI may be disposed in the substrate 100. On the cell block region CB, the device isolation pattern STI may define active patterns ACT.

The active patterns ACT may have a shape protruding in a third direction D3 that is perpendicular to a bottom surface of the substrate 100. As an example, the active patterns ACT may be portions of the substrate 100 surrounded by the device isolation pattern STI. For the sake of convenience in explanation, the term "substrate 100" may refer to the remaining portion of the substrate 100, excluding the active patterns ACT, unless otherwise stated or clear from context.

The active patterns ACT may be isolated patterns such as isolated bar-shaped patterns, which are spaced apart from each other and are elongated in a fourth direction D4. The fourth direction D4 may be parallel to the bottom surface of the substrate 100, but may intersect the first and second directions D1 and D2 at angles, such as angles that are not ninety degrees.

The device isolation pattern STI may be formed of or include at least one of insulating materials (e.g., silicon oxide and/or silicon nitride), such as but not limited to a shallow trench isolation (STI) oxide. The device isolation pattern STI may be a single layer, which is made of a single material, or a composite layer including two or more materials.

A word line WL may be provided in the active patterns ACT. In some example embodiments, a plurality of word lines WL may be provided. The word lines WL may extend in the second direction D2 and may be spaced apart from each other in the first direction D1. The word lines WL may be disposed in trenches, which are formed in or defined by the active patterns ACT and the device isolation pattern STI. As an example, a pair of word lines WL, which are adjacent to each other in the first direction D1, may be provided to cross each of the active patterns ACT.

Each of the word lines WL may include a gate electrode (not shown), a gate dielectric pattern (not shown), and a gate capping pattern (not shown). The gate electrode may be provided to penetrate the active patterns ACT and the device isolation pattern STI in the second direction D2. The gate dielectric pattern may be interposed between the gate electrode and the active patterns ACT and between the gate electrode and the device isolation pattern STI. The gate capping pattern may be provided on the gate electrode to cover a top surface of the gate electrode. In some example embodiments, the gate electrode may be formed of or include at least one of metallic materials (e.g., one or more of Ti, Mo, W, Cu, Al, Ta, Ru, and Ir). The gate insulating pattern may be formed of or include at least one of silicon oxide or high-k dielectric materials. as used herein, the high-k dielectric material may be defined as a material having a dielectric constant higher than silicon oxide. The gate capping pattern may be formed of or include silicon nitride.

A buffer pattern 210 may be disposed on the substrate 100. The buffer pattern 210 may cover the active patterns ACT, the device isolation pattern STI, and the word lines WL. The buffer pattern 210 may be formed of or include at least one of silicon oxide, silicon nitride, silicon oxynitride, or combinations thereof. The buffer pattern 210 may be a single layer, which is made of a single material, or a composite layer including two or more materials.

A bit line node contact DC may be provided on each of the active patterns ACT, and in some example embodiments, a plurality of bit line node contacts DC may be provided. The bit line node contacts DC may be electrically connected to center portions CA of the active patterns ACT, respectively. The bit line node contacts DC may be spaced apart from each other in the first and second directions D1 and D2. The bit line node contacts DC may be respectively interposed between the active patterns ACT and bit lines BL, which will be described below. Each of the bit line node contacts DC may electrically connect a corresponding one of the bit lines BL to the center portion CA of a corresponding one of the active patterns ACT.

The bit line node contacts DC may be disposed in first recess regions RS1, respectively. The first recess regions RS1 may be provided in upper portions of the active patterns ACT and an upper portion of the device isolation pattern STI adjacent thereto. The first recess regions RS1 may be spaced apart from each other in the first and second directions D1 and D2.

A gapfill insulating pattern 250 may be provided to fill each of the first recess regions RS1. The gapfill insulating pattern 250 may fill an inner space of the first recess region RS1. In some example embodiments, the gapfill insulating pattern 250 may cover an inner surface of the first recess region RS1 as well as at least a portion of a side surface of the bit line node contact DC (e.g., in the first recess region RS1). The gapfill insulating pattern 250 may be formed of or include at least one of silicon oxide, silicon nitride, or combinations thereof. The gapfill insulating pattern 250 may be a single layer, which is made of a single material, or a composite layer including two or more materials.

The bit line BL may be disposed on the active pattern ACT. The bit line node contact DC may be disposed between the bit line BL and the active pattern ACT to electrically connect them to each other. In some example embodiments, a plurality of bit lines BL may be provided. The bit lines BL may extend in the first direction D1 and may be arranged in the second direction D2. Each of the bit lines BL may extend in the first direction D1, on the active patterns ACT, which are adjacent to each other in the second direction D2.

The active pattern ACT may include a first active pattern ACT1 and a second active pattern ACT2. The first active pattern ACT1 and the second active pattern ACT2 may be spaced apart from each other in the second direction D2.

The bit line BL may be interposed between an inner spacer IS and an outer spacer OS, which will be described below. The bit line BL may be or may correspond to a folded bit line and may include the bit lines BL, which are adjacent to each other in the second direction D2. In some example embodiments, one of pair of the adjacent bit lines BL may correspond to a "true" bit line, and another of the pair of adjacent bit lines may correspond to a "complementary" bit line; example embodiments are not limited thereto. The adjacent ones of the bit lines BL may be electrically connected to each other and may be driven together by a single electrical signal applied thereto. In some example embodiments, if during the operation of the semiconductor device, an electrical signal is directly applied to one of the adjacent ones of the bit lines BL, the electrical signal may also be applied to the other of the adjacent ones of the bit lines BL.

In some example embodiments, the bit line BL may include a first conductive portion B1 and a second conductive portion B2, which are spaced apart from each other. The first and second conductive portions B1 and B2 may extend in the first direction D1. In some example embodiments, the first conductive portion B1 may be provided on one of the active patterns ACT, which are adjacent to each other in the second direction D2, and the second conductive portion B2 may be provided on the other of the active patterns ACT. In some example embodiments, the first conductive portion B1 may be provided on the first active pattern ACT1, and the second conductive portion B2 may be provided on the second active pattern ACT2. The first conductive portion B1 may be vertically overlapped with the first active pattern ACT1, and the second conductive portion B2 may be vertically overlapped with the second active pattern ACT2.

The first conductive portion B1 may include a first linear portion B1_S, a first intervening portion IP1, and a first curved portion B1_C. The second conductive portion B2 may include a second linear portion B2_S, a second intervening portion IP2, and a second curved portion B2_C. The first linear portion B1_S and the second linear portion B2_S may be spaced apart from each other in the second direction D2.

The first and second curved portions B1_C and B2_C may be rounded toward the peripheral region 120. The first and second curved portions B1_C and B2_C may be provided on the cell block region CB and near the peripheral region 120.

A first insulating structure ICS1 may be interposed between the first curved portion B1_C and the second linear portion B2_S. The first curved portion B1_C and the second linear portion B2_S may be separated from each other by the first insulating structure ICS1.

A second insulating structure ICS2 may be interposed between the second curved portion B2_C and the first linear portion B1_S. The second curved portion B2_C and the first linear portion B1_S may be separated from each other by the second insulating structure ICS2.

The bit line BL may include the first intervening portion IP1 and the second intervening portion IP2. A first linear portion B1_Sa, a second linear portion B2_Sa, the first intervening portion IP1, and the second intervening portion IP2 may be disposed between the first and second curved portions B1_C and B2_C. The second insulating structure ICS2 may be disposed between the first linear portion B1_Sa and the second intervening portion IP2. The first insulating structure ICS1 may be disposed between the second linear portion B2_Sa and the first intervening portion IP1.

The first intervening portion IP1 may be connected to the first curved portion B1_C and may be in contact with the first insulating structure ICS1. An outer side surface of the first intervening portion IP1 may be in contact with the outer spacer OS. An inner side surface of the first intervening portion IP1 may be in contact with the inner spacer IS.

A width B1_CH of the first curved portion B1_C may be larger than a width BL_SW of the first linear portion B1_S. The width B1_CH of the first curved portion B1_C may be the largest width of the first curved portion B1_C in the first direction D1. The width BL_SW of the first linear portion B1_S may be equal to a width ICS1_W of the first insulating structure ICS1. The description of the first curved portion B1_C and the first linear portion B1_S may hold true of the second curved portion B2_C and the second linear portion B2_S; example embodiments are not limited thereto.

The second intervening portion IP2 may be connected to the second curved portion B2_C and may be in contact with the second insulating structure ICS2. An outer side surface of the second intervening portion IP2 may be in contact with the outer spacer OS. An inner side surface of the second intervening portion IP2 may be in contact with the inner spacer IS.

The bit line BL may include an inner side surface BL_I and an outer side surface BL_O. The outer spacer OS may be provided on the outer side surface BL_O of the bit line BL. The inner spacer IS may be provided on the inner side surface BL_I of the bit line BL.

The outer spacer OS may be provided to enclose or at least partly enclose the first curved portion B1_C, the second curved portion B2_C, the first intervening portion IP1, the second intervening portion IP2, the first linear portion B1_S, and the second linear portion B2_S of the bit line BL. The first curved portion B1_C, the second curved portion B2_C, the first intervening portion IP1, the second intervening portion IP2, the first linear portion B1_S, and the second linear portion B2_S of the bit line BL may be interposed between the outer spacer OS and the inner spacer IS.

The bit line BL may be formed of or include at least one of metallic materials (e.g., one or more of Ti, Mo, W, Cu, Al, Ta, Ru, and Ir). In some example embodiments, each of the first and second conductive portions B1 and B2 may be formed of or include at least one of metallic materials (e.g., one or more of Ti, Mo, W, Cu, Al, Ta, Ru, and Ir). The first and second conductive portions B1 and B2 may be formed of or include the same material; however, example embodiments are not limited thereto.

Bit line trench regions BTR1 and BTR2 may be defined by the bit line BL. The bit line trench regions BTR1 and BTR2 may include a first bit line trench region BTR1 and a second bit line trench region BTR2. The first bit line trench region BTR1 may be defined by the inner side surface BL_I of the bit line BL. The second bit line trench region BTR2 may be defined by the outer side surface BL_O of the bit line BL. The second bit line trench region BTR2 may be defined between the bit lines BL, which are adjacent to each other in the second direction D2.

The inner spacer IS may be provided on an inner side surface of the first bit line trench region BTR1. The inner spacer IS may cover a side surface of a bit line capping pattern 350, which will be described below. The inner spacer IS may be a single layer or a composite layer. As an example, the inner spacer IS may be formed of or include at least one of silicon nitride, silicon oxide, or silicon oxynitride. In some example embodiments, the inner spacer IS may further include an air gap (not illustrated). The air gap may include air, such as clean, dry air (CDA); example embodiments are not limited thereto.

The outer spacer OS may be provided to enclose the bit line BL. The outer spacer OS may be provided on an inner side surface of the second bit line trench region BTR2 (e.g., the outer side surface BL_O of the bit line BL. The outer spacer OS may cover other side surface of the bit line capping pattern 350.

The outer spacer OS may be a single layer or a composite layer. As an example, the outer spacer OS may be formed of or include at least one of silicon nitride, silicon oxide, or silicon oxynitride. In some example embodiments, the outer spacer OS may further include an air gap.

The inner and outer spacers IS and OS may minimize or reduce an electrical interference issue between the bit line BL and neighboring conductive patterns.

As an example, the inner and outer spacers IS and OS may minimize or reduce an electrical interference issue between the bit line BL and storage node contacts BC, which will be described below. As a result, the electrical and/or reliability characteristics of the semiconductor device may be improved.

The first insulating structure ICS1 may include a first inner surface ICS1_I and a first outer surface ICS1_O. The first inner surface ICS1_I of the first insulating structure ICS1 may be in contact with the inner spacer IS. The first outer surface ICS1_O of the first insulating structure ICS1 may be in contact with the outer spacer OS. The width ICS1_W of the first insulating structure ICS1 may be equal to the width BL_SW of the first linear portion B1_S of the bit line BL. The description of the first insulating structure ICS1 may hold true of the second insulating structure ICS2.

The bit line capping pattern 350 may be provided on a bit line structure BLS. In some example embodiments, the bit line capping patterns 350 may be provided on the top surfaces of the bit lines BL, respectively. The bit line capping pattern 350 may extend along the corresponding bit line BL or in the first direction D1 and may be spaced apart from each other in the second direction D2. Each of the bit line capping patterns 350 may vertically overlap a corresponding one of the bit lines BL. The bit line capping pattern 350 may be composed of a single layer or a plurality of layers. In some example embodiments, the bit line capping pattern 350 may include a first capping pattern (not shown), a second capping pattern (not shown), and a third capping pattern (not shown), which are sequentially stacked. As an example, the first to third capping patterns may be formed of or include silicon nitride. As another example, the bit line capping pattern 350 may further include additional capping patterns (e.g., fourth and fifth capping patterns (not shown)).

An intervening pattern 310 may be provided between the bit line BL and the buffer pattern 210. In some example embodiments, a plurality of intervening patterns 310 may be provided. In some example embodiments, a top surface of the intervening pattern 310 may be located at substantially the same level as a top surface of the bit line node contact DC and may be substantially coplanar with the top surface of the bit line node contact DC. The intervening pattern 310 may be formed of or include polysilicon (e.g., doped or undoped polysilicon).

A first ohmic pattern 320 may be interposed between the bit line BL and the bit line node contact DC, between the bit line BL and the intervening pattern 310, and between the bit line BL and the insulating structure ICS1 or ICS2. The first ohmic pattern 320 may be formed of or include a metal silicide material. A first barrier pattern (not shown) may be further interposed between the bit line BL and the bit line node contact DC and between the bit line BL and the intervening pattern 310. The first barrier pattern may be formed of or include at least one of conductive metal nitride materials (e.g., nitride materials containing one or more of Ti, Mo, W, Cu, Al, Ta, Ru, and Ir).

The first insulating structure ICS1 may be provided on the first ohmic pattern 320. A top surface ICS1_TS of the first insulating structure ICS1 may be in contact with the bit line capping pattern 350. A bottom surface ICS1_BS of the first insulating structure ICS1 may be in contact with the first ohmic pattern 320. The description of the first insulating structure ICS1 may hold true of the second insulating structure ICS2.

A top surface B1_TS of the first conductive portion B1 may be located at the same level as the top surface ICS1_TS of the first insulating structure ICS1. The bottom surface B1_BS of the first conductive portion B1 may be located at the same level as the bottom surface ICS1_BS of the first insulating structure ICS1.

A storage node contact BC may be provided between adjacent ones of the bit lines BL. In some example embodiments, a plurality of storage node contacts BC may be provided to be spaced apart from each other in the first and second directions D1 and D2. As an example, a portion of the storage node contacts BC may be interposed between the first and second conductive portions B1 and B2 of the bit line BL. As another example, another portion of the storage node contacts BC may be interposed between the bit line BL, which are adjacent to each other in the second direction D2. The storage node contact BC may fill a second recess region RS2 on the active pattern ACT. The storage node contact BC may be electrically connected to the active pattern ACT. The storage node contact BC may include a conductive material. In some example embodiments, the storage node contact BC may be formed of or include at least one of polysilicon (e.g., doped or undoped polysilicon) or metallic materials (e.g., one or more of Ti, Mo, W, Cu, Al, Ta, Ru, and Ir).

On the word lines WL, fence patterns (not shown) may separate the storage node contacts BC from each other in the first direction D1. In some example embodiments, the fence patterns may be adjacent to each other in the first direction D1, with the storage node contacts BC interposed therebetween. The fence patterns may be formed of or include silicon nitride.

A second barrier pattern 410 may conformally cover the inner spacer IS, the outer spacer OS, and the storage node contact BC. The second barrier pattern 410 may be formed of or include at least one of conductive metal nitride materials (e.g., nitride materials containing one or more of Ti, Mo, W, Cu, Al, Ta, Ru, and Ir). A second ohmic pattern (not shown) may be further interposed between the second barrier pattern 410 and the storage node contact BC. The second ohmic pattern may be formed of or include a metal silicide material.

A landing pad LP may be provided on the storage node contact BC. In some example embodiments, a plurality of landing pads LP may be provided to be spaced apart from each other in the first and second directions D1 and D2. Each of the landing pads LP may be connected to a corresponding one of the storage node contacts BC. The landing pad LP may cover a top surface of the bit line capping pattern 350. An upper portion of the landing pad LP may be vertically overlapped with a portion of the storage node contact BC. In some example embodiments, a lower portion of the landing pad LP may be vertically overlapped with the storage node contact BC, and the upper portion of the landing pad LP may be shifted from the lower portion in the second direction D2 or an opposite direction thereof. The landing pad LP may be formed of or include at least one of metallic materials (e.g., one or more of Ti, Mo, W, Cu, Al, Ta, Ru, and Ir).

A filler pattern 440 may be provided to enclose the landing pad LP. The filler pattern 440 may be interposed between adjacent ones of the landing pads LP. When viewed in a plan view, the filler pattern 440 may be provided in the shape of a mesh with holes, and in this case, the landing pads LP may be provided in the holes to penetrate the filler pattern 440. As an example, the filler pattern 440 may be formed of or include at least one of silicon nitride, silicon oxide, or silicon oxynitride. Alternatively, the filler pattern 440 may include an empty space with an air layer (e.g., an air gap).

A contact plug CP may be provided on the bit line BL. The contact plug CP may be provided on the curved portion B1_C of the bit line BL. The contact plug CP may be overlapped with the curved portion B1_C of the bit line BL. The contact plug CP may include a conductive material. A bottom surface CP_BS of the contact plug CP may be in contact with the curved portion B1_C of the bit line BL. The contact plug CP may be electrically connected to the bit line BL.

The contact plug CP may be provided to penetrate the filler pattern 440 and the bit line capping pattern 350 in the third direction D3 and may be connected to the bit line BL. In some example embodiments, the contact plug CP may be connected to the curved portion B1_C of the first conductive portion B1. The contact plug CP may be formed of or include the same material as the landing pad LP. A level of the bottom surface CP_BS of the contact plug CP may be lower than a level of a top surface of the curved portion B1_C of the bit line BL.

Contact lines CL may be provided on the filler pattern 440 and may be connected to the contact plug CP. In some example embodiments, the contact lines CL may be stacked to form one or more interconnection layers. The contact lines CL may be connected to core circuits, which are formed on the core region.

A data storage pattern DSP may be provided on the landing pad LP. In some example embodiments, a plurality of data storage patterns DSP may be provided. The data storage patterns DSP may be spaced apart from each other in the first and second directions D1 and D2. Each of the data storage patterns DSP may be electrically connected to a corresponding one of the active patterns ACT through a corresponding one of the landing pads LP and a corresponding one of the storage node contacts BC.

In some example embodiments, the data storage pattern DSP may be or may include a capacitor including a bottom electrode, a dielectric layer, and a top electrode. In this case, the semiconductor memory device according to some example embodiments of inventive concepts may be or may include a dynamic random access memory (DRAM) device. Alternatively or additionally, the data storage pattern DSP may be or may include a magnetic tunnel junction pattern. In this case, the semiconductor memory device may be or may include a magnetic random access memory (MRAM) device. Alternatively or additionally, the data storage pattern DSP may be formed of or include a phase-change material or a variable resistance material. In this case, the semiconductor memory device may be or may include a phase-change random access memory (PRAM) device and/or a resistive random access memory (ReRAM) device. However, the example embodiments are not limited to these examples, and the data storage pattern DSP may include various structures and/or materials which can be used to store data.

Hereinafter, a semiconductor device according to some example embodiments of inventive concepts will be described with reference to FIGS. 6 to 7. In the following description, a previously-described element may be identified by the same reference number without repeating an overlapping description thereof, for concise description.

Figure 6:
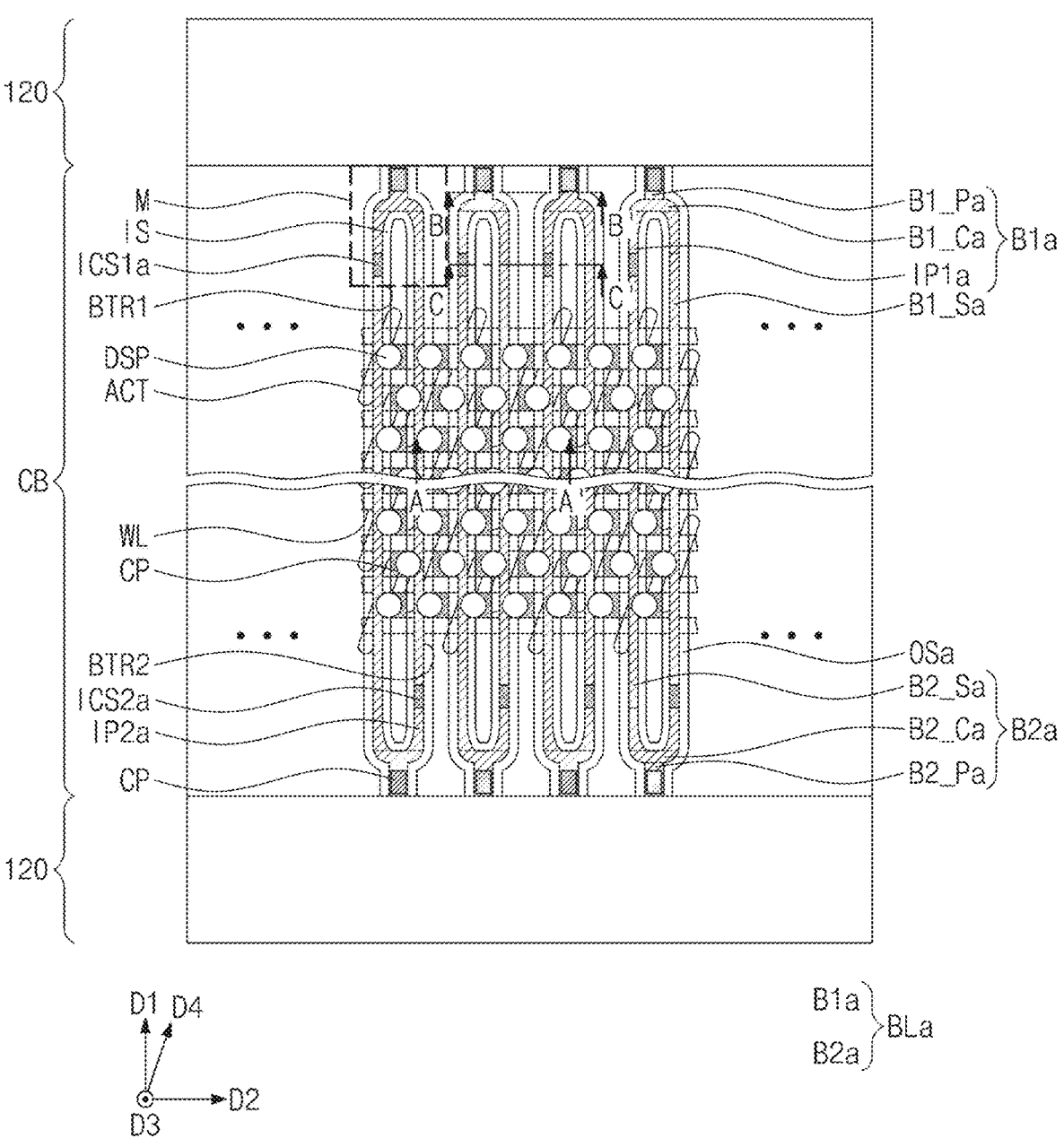
FIG. 6 is a plan view illustrating a semiconductor device, according to some example embodiments.
Figure 7:
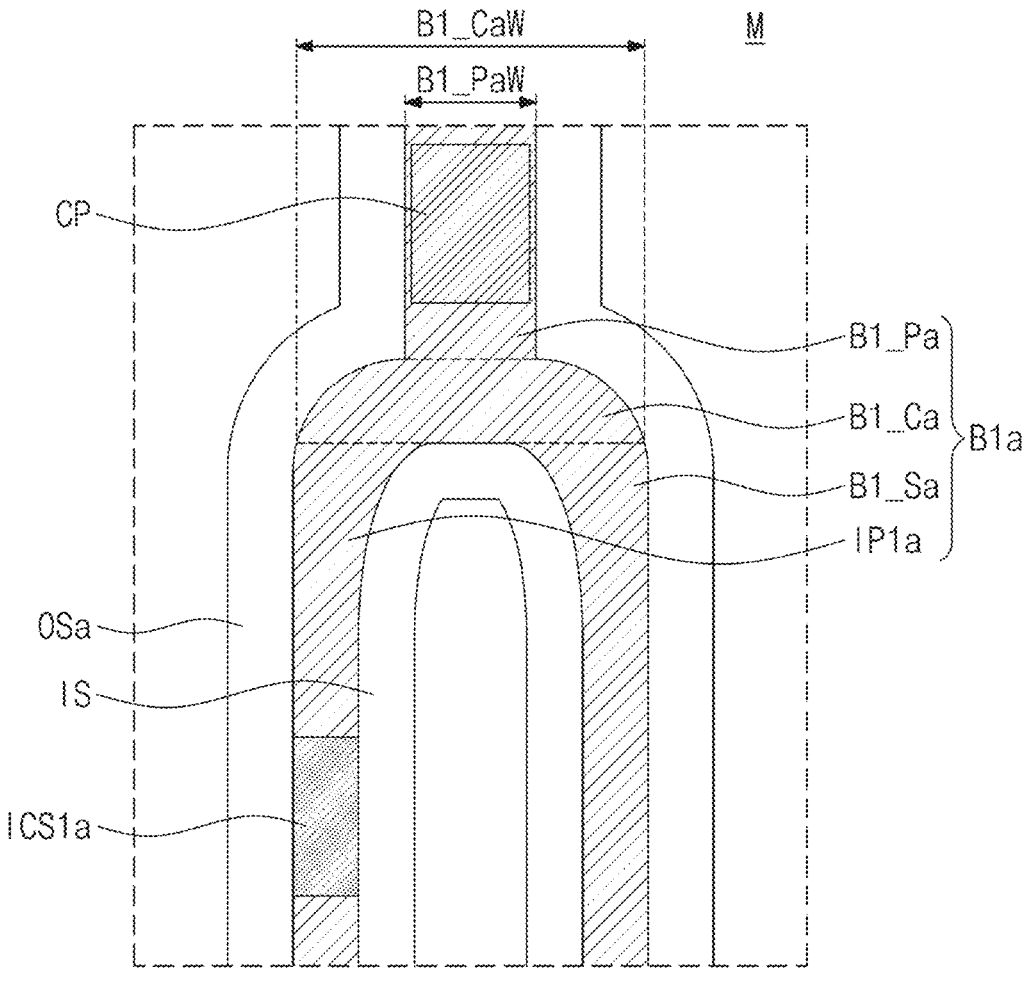
FIG. 7 is an enlarged plan view illustrating a portion 'M' of FIG. 6.

FIG. 6 is a plan view illustrating a semiconductor device, according to some example embodiments of inventive concepts. FIG. 7 is an enlarged plan view illustrating a portion 'M' of FIG. 6.

Referring to FIG. 6, a bit line BLa and an outer spacer OSa may be provided on the cell block region CB. The bit line BLa may include a first conductive portion B1a and a second conductive portion B2a.

The first conductive portion B1a may include a linear portion B1_Sa, a curved portion B1_Ca, and a protruding portion B1_Pa. The second conductive portion B2a may include a linear portion B2_Sa, a curved portion B2_Ca, and a protruding portion B2_Pa.

The curved portion B1_Ca of the first conductive portion B1a may be interposed between the linear portion B1_Sa and the protruding portion B1_Pa of the first conductive portion B1a. The curved portion B1_Ca of the first conductive portion B1a may include a curved surface. The protruding portion B1_Pa of the first conductive portion B1a may extend from the curved portion B1_Ca of the first conductive portion B1a toward the peripheral region 120. A width B1_PaW of the protruding portion B1_Pa may be the largest width of the protruding portion B1_Pa in the second direction D2. The width B1_PaW of the protruding portion B1_Pa of the first conductive portion B1a may be smaller than a width B1_CaW of the curved portion B1_Ca of the first conductive portion B1a. The description of the first conductive portion Bla may hold true of the second conductive portion B2a.

The protruding portion B1_Pa of the first conductive portion B1a may be overlapped with the contact plug CP. The contact plug CP may be electrically connected to the protruding portion B1_Pa of the first conductive portion B1. The protruding portion B1_Pa of the first conductive portion B1a may overlap with the cell block region CB.

The outer spacer OSa may be provided on an outer side surface of the first conductive portion B1a. The inner spacer IS may be provided on an inner side surface of the first conductive portion B1a. The curved portion B1_Ca and the protruding portion B1_Pa of the first conductive portion B1a may be interposed between the outer spacers OSa. The linear portion B1_S of the first conductive portion B1a may be interposed between the outer spacer OSa and the inner spacer IS.

The inner spacer IS may be provided on the inner side surface of the first bit line trench region BTR1. The outer spacer OSa may be provided to enclose the first conductive portion B1a. The outer spacer OSa may be provided on the inner side surface of the second bit line trench region BTR2.

FIGS. 8A to 14D are diagrams illustrating a method of fabricating a semiconductor device, according to some example embodiments of inventive concepts. In more detail, FIGS. 8A, 9A, 10A, 11A, 12A, 13A and FIG. 14A are plan views illustrating a method of fabricating a semiconductor device, according to some example embodiments of inventive concepts. FIGS. 8B, 9B, 10B, 11B, 12B, 13B, and 14B are sectional views, which are respectively taken along lines A-A' of FIGS. 8A, 9A, 10A, 11A, 12A, 13A, and 14A. FIGS. 8C, 9C, 10C, 11C, 12C, 13C, and 14C are sectional views, which are respectively taken along lines B-B' of FIGS. 8A, 9A, 10A, 11A, 12A, 13A, and 14A. FIGS. 9D, 10D, 11D, 12D, 13D, and 14D are sectional views, which are respectively taken along lines C-C' of FIGS. 9A, 10A, 11A, 12A, 13A, and 14A.

Hereinafter, a semiconductor fabrication method according to some example embodiments of inventive concepts will be described with reference to FIGS. 8A to 14D. In the following description, a previously-described element may be identified by the same reference number without repeating an overlapping description thereof, for concise description.

Figure 8A:
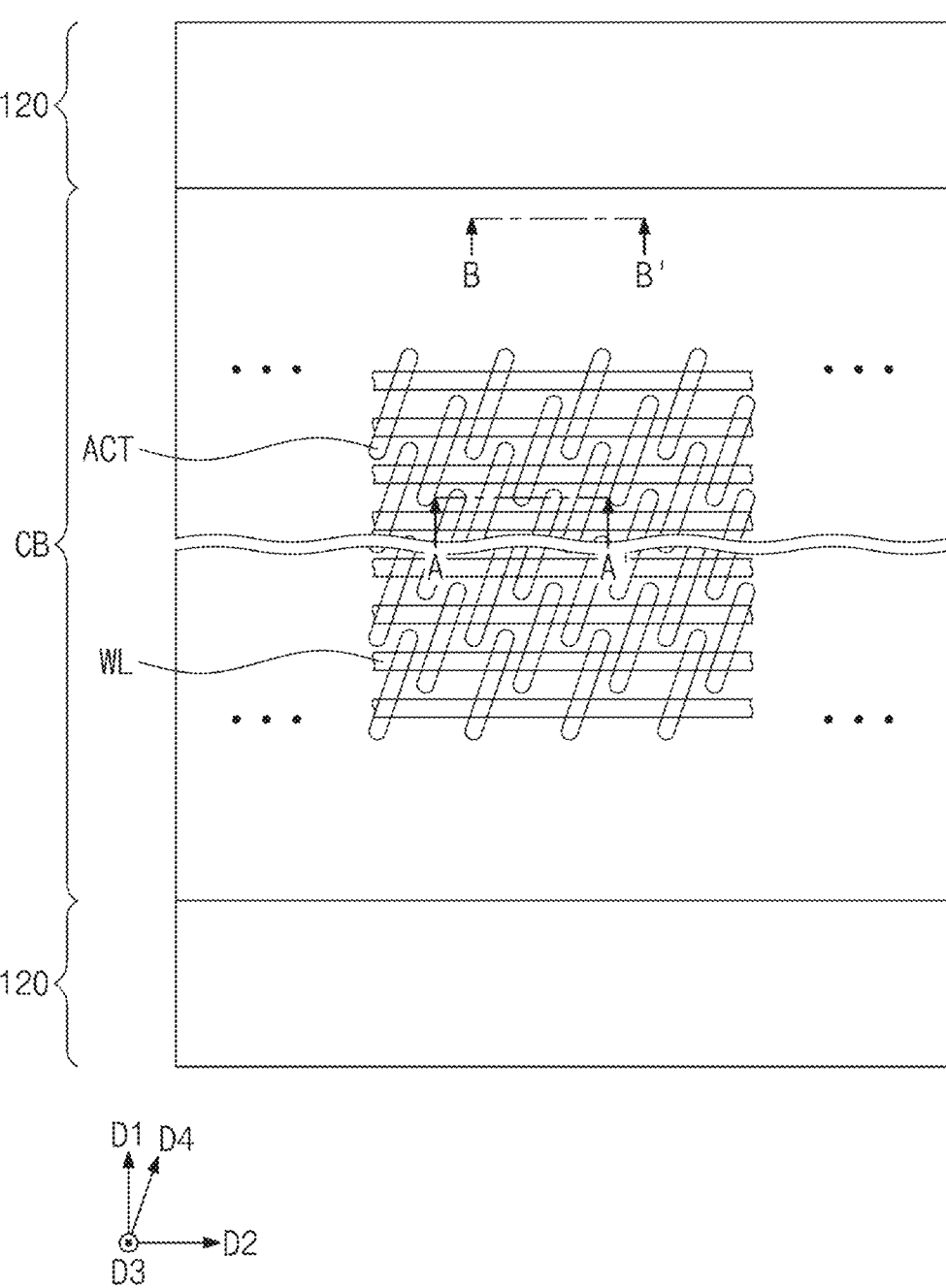
FIGS. 8A to 14D are diagrams illustrating a method of fabricating a semiconductor device, according to some example embodiments.
Figure 8B:
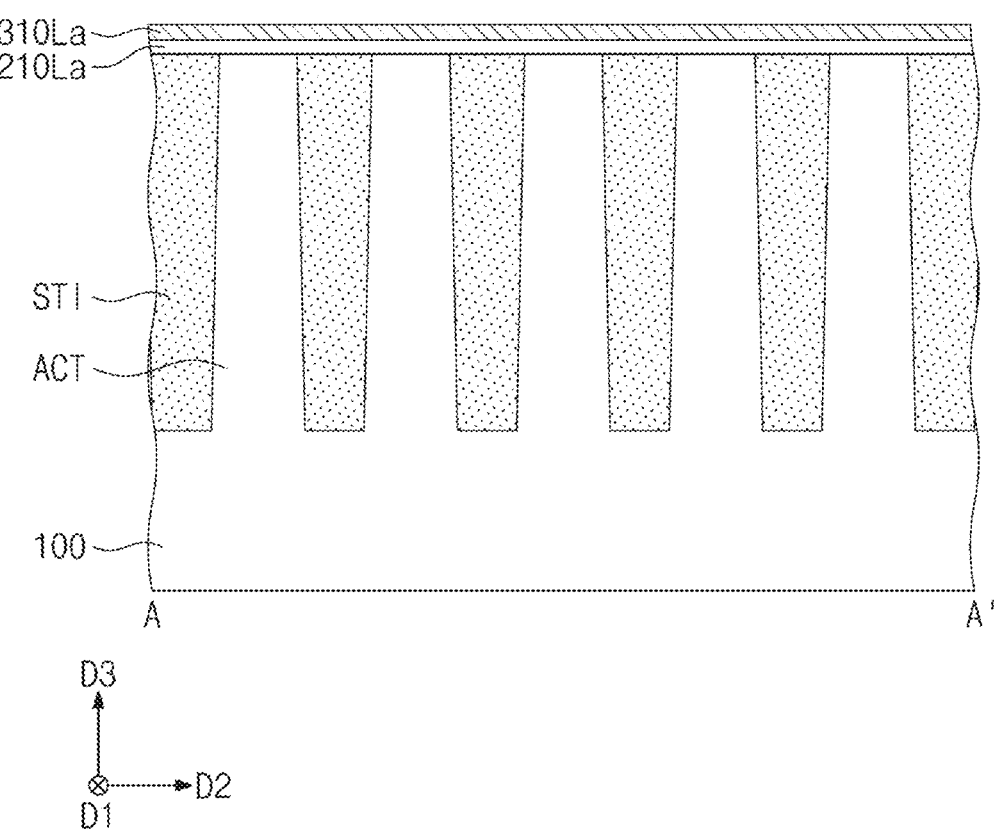
Figure 8C:
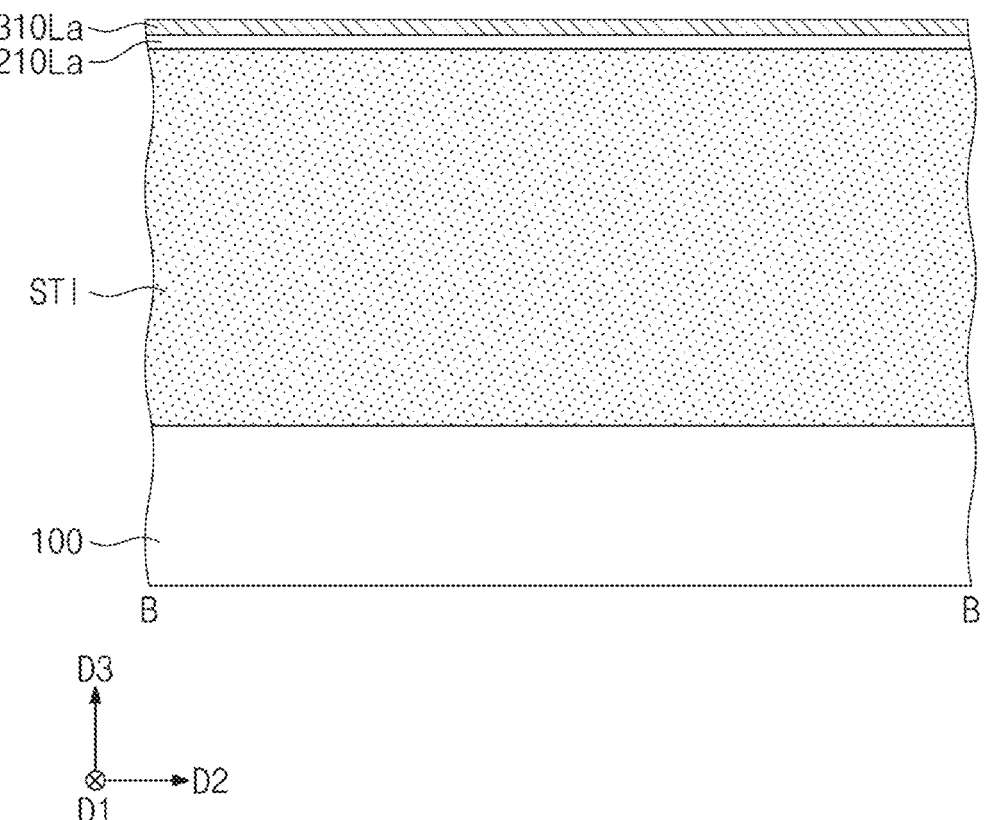
Figure 9A:
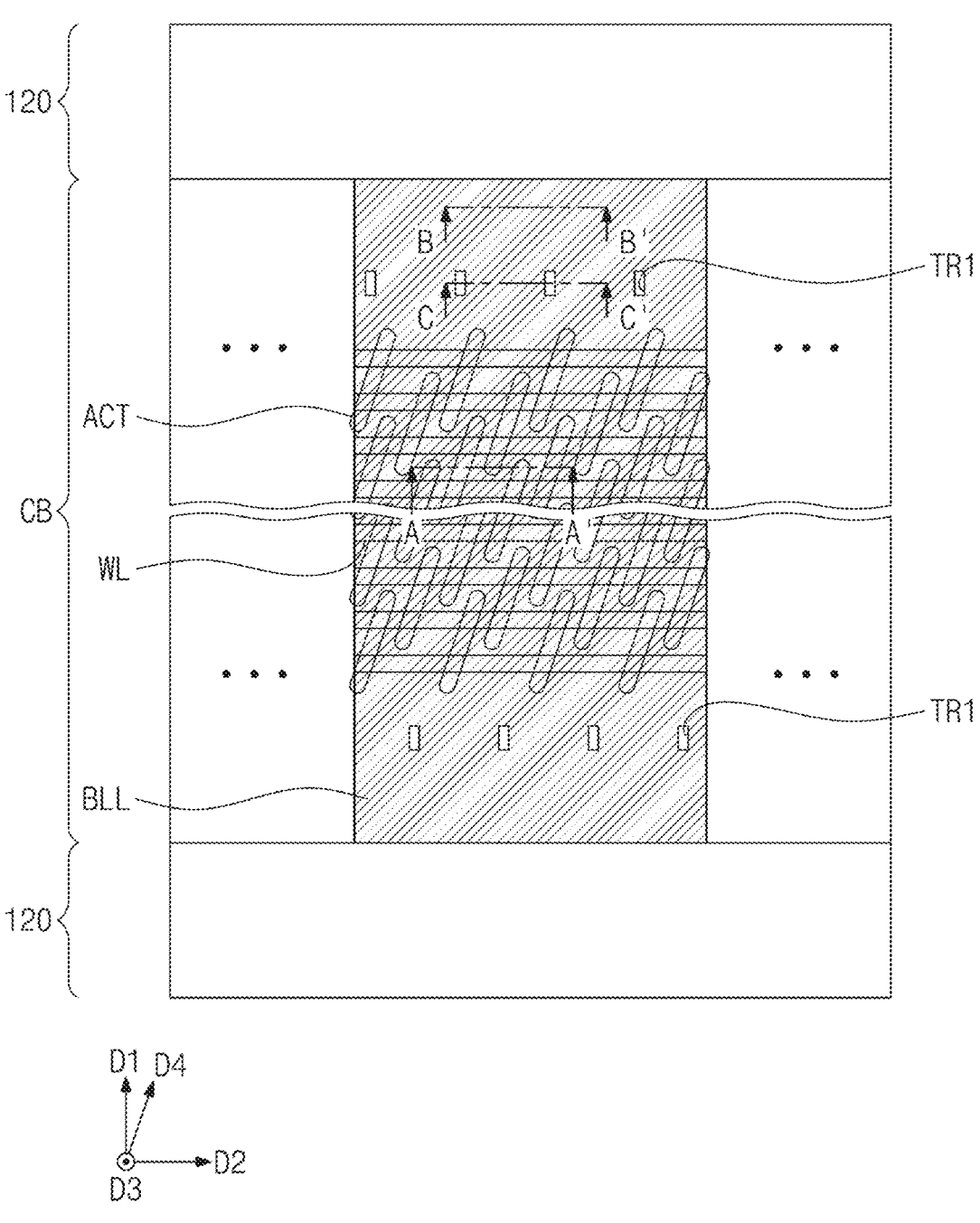
Figure 9B:
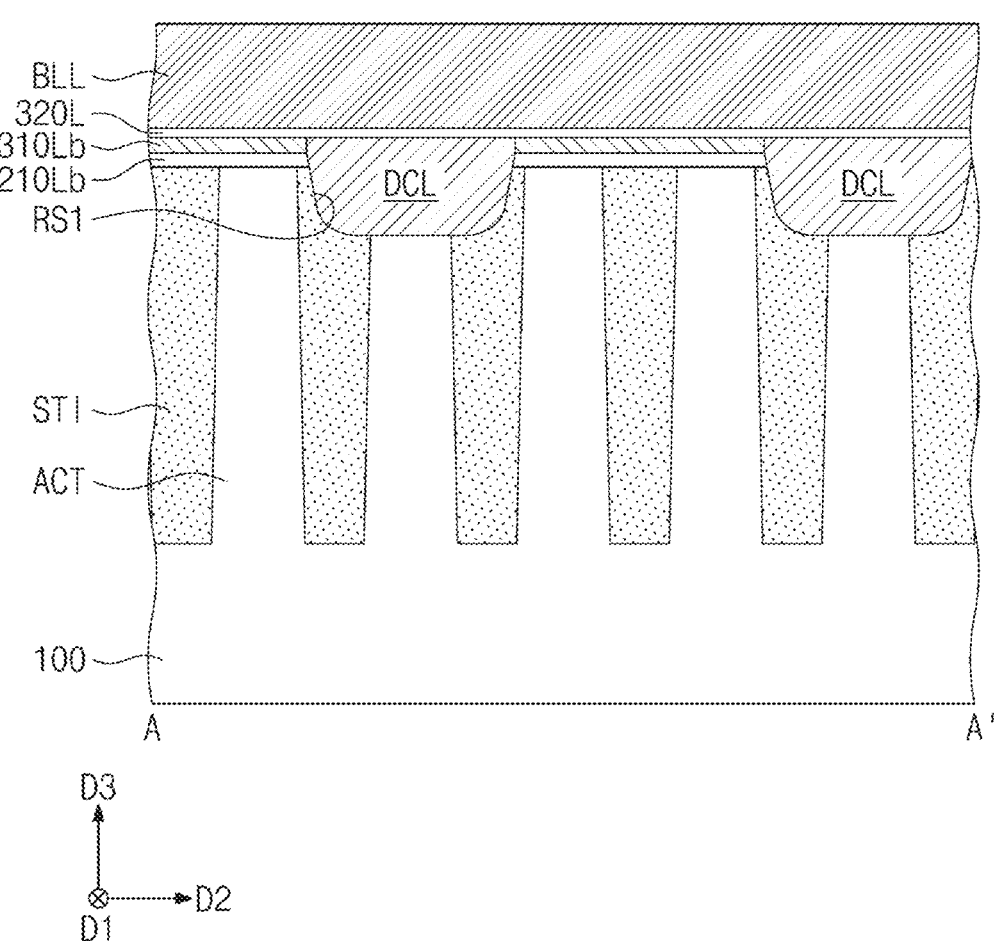
Figure 9C:
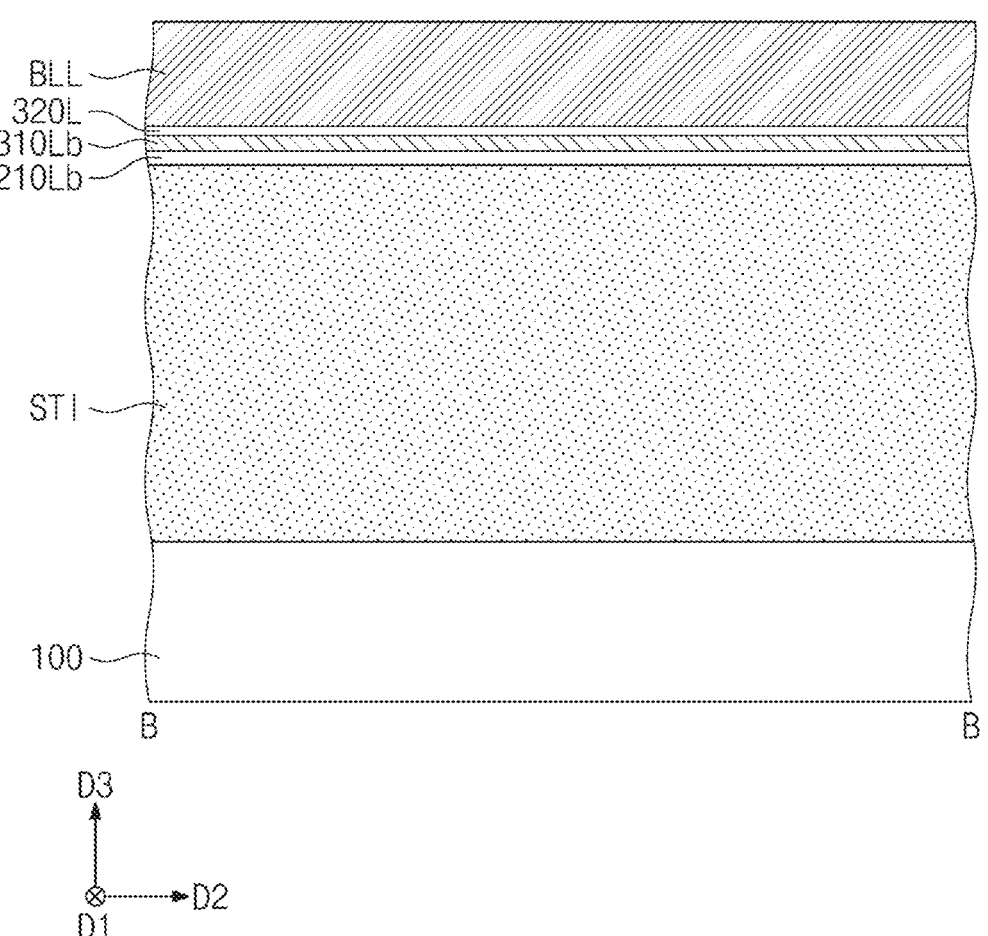
Figure 9D:
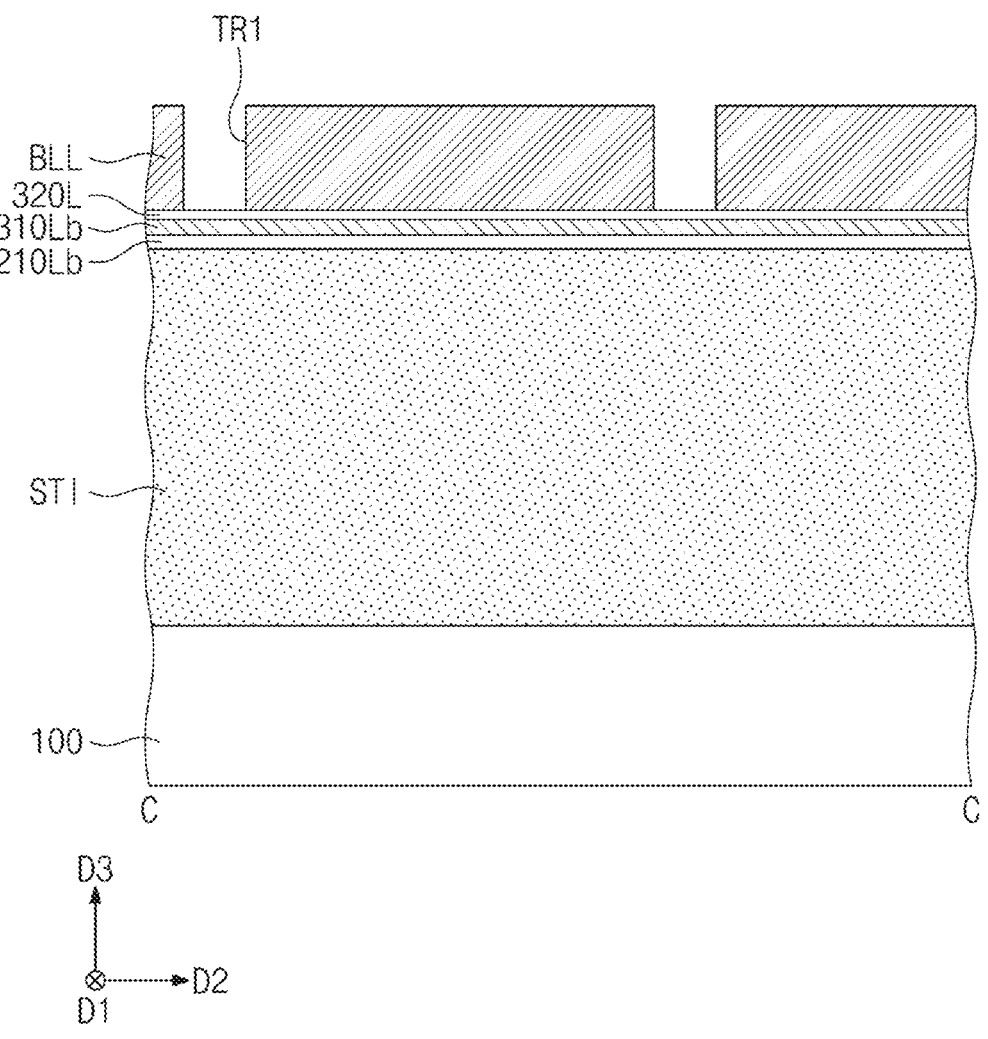
Figure 10A:
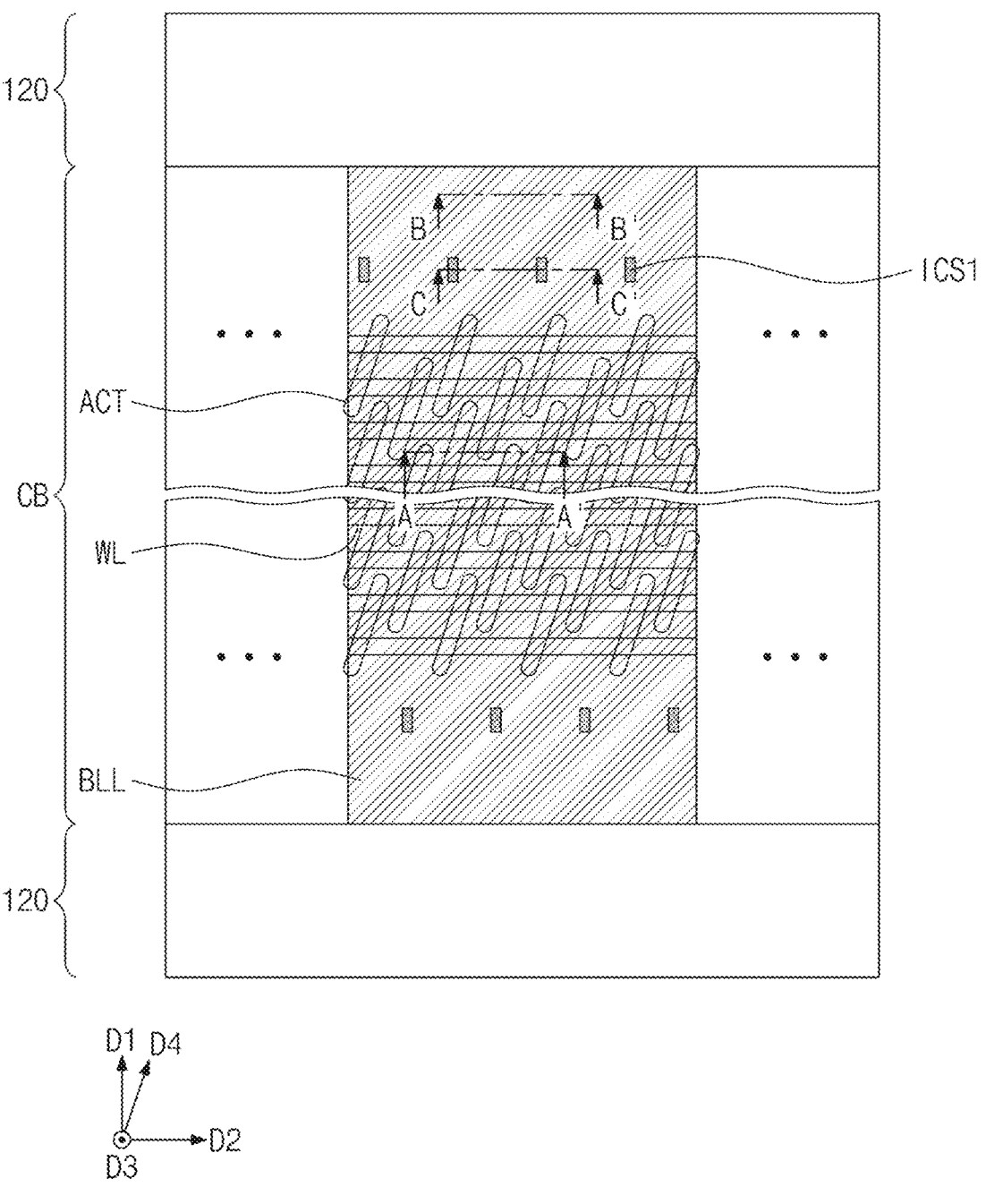
Figure 10B:
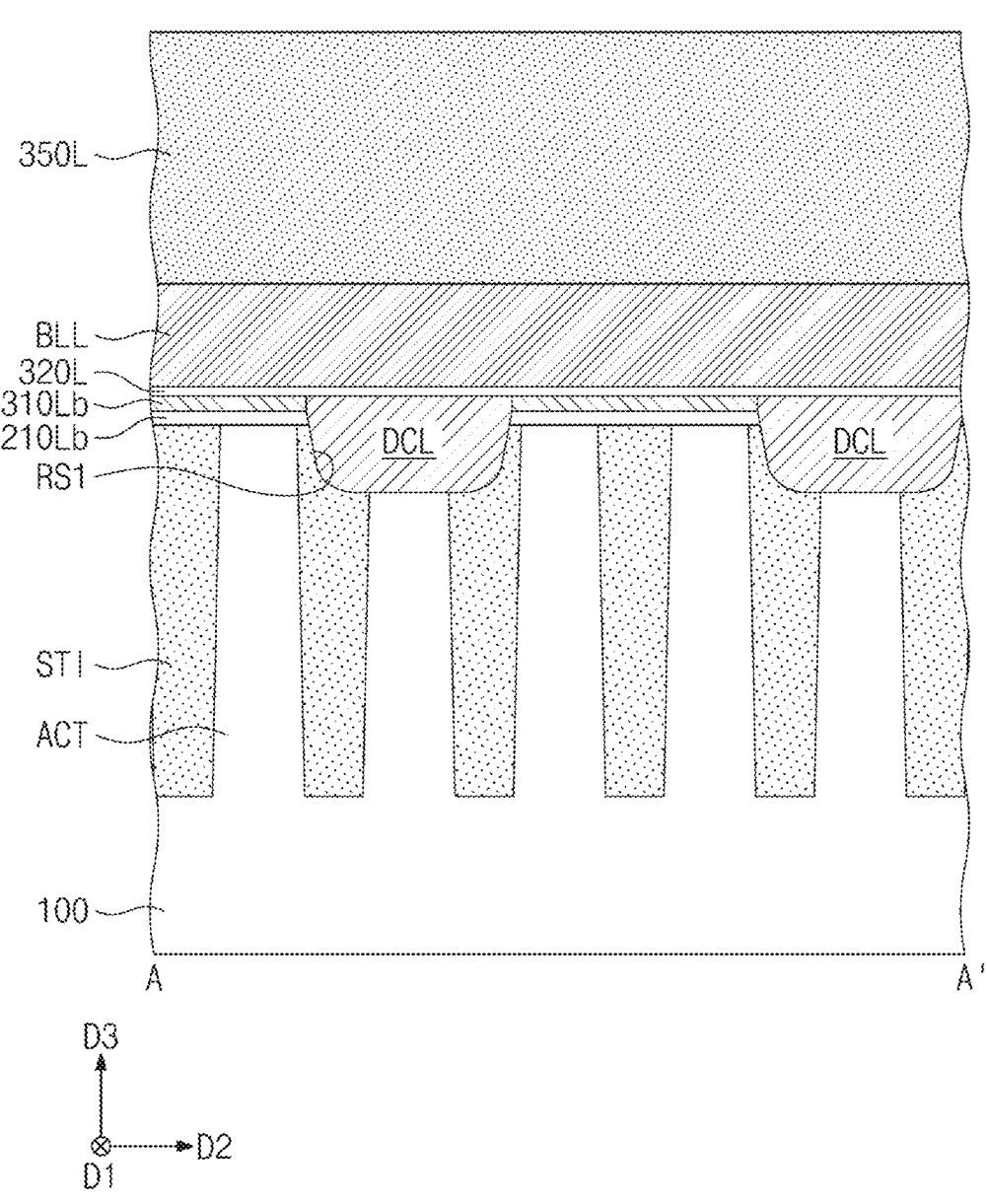
Figure 10C:
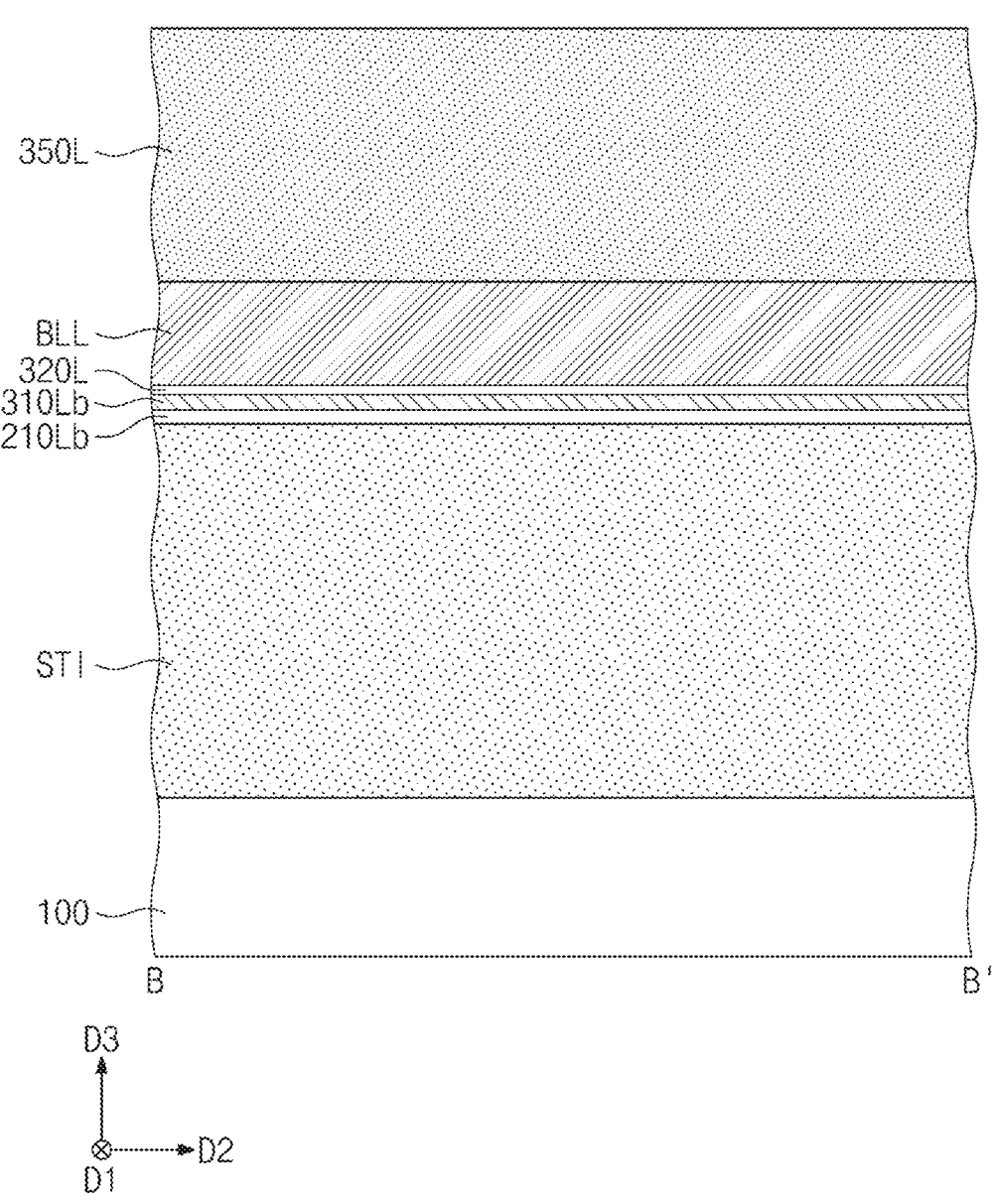
Figure 10D:
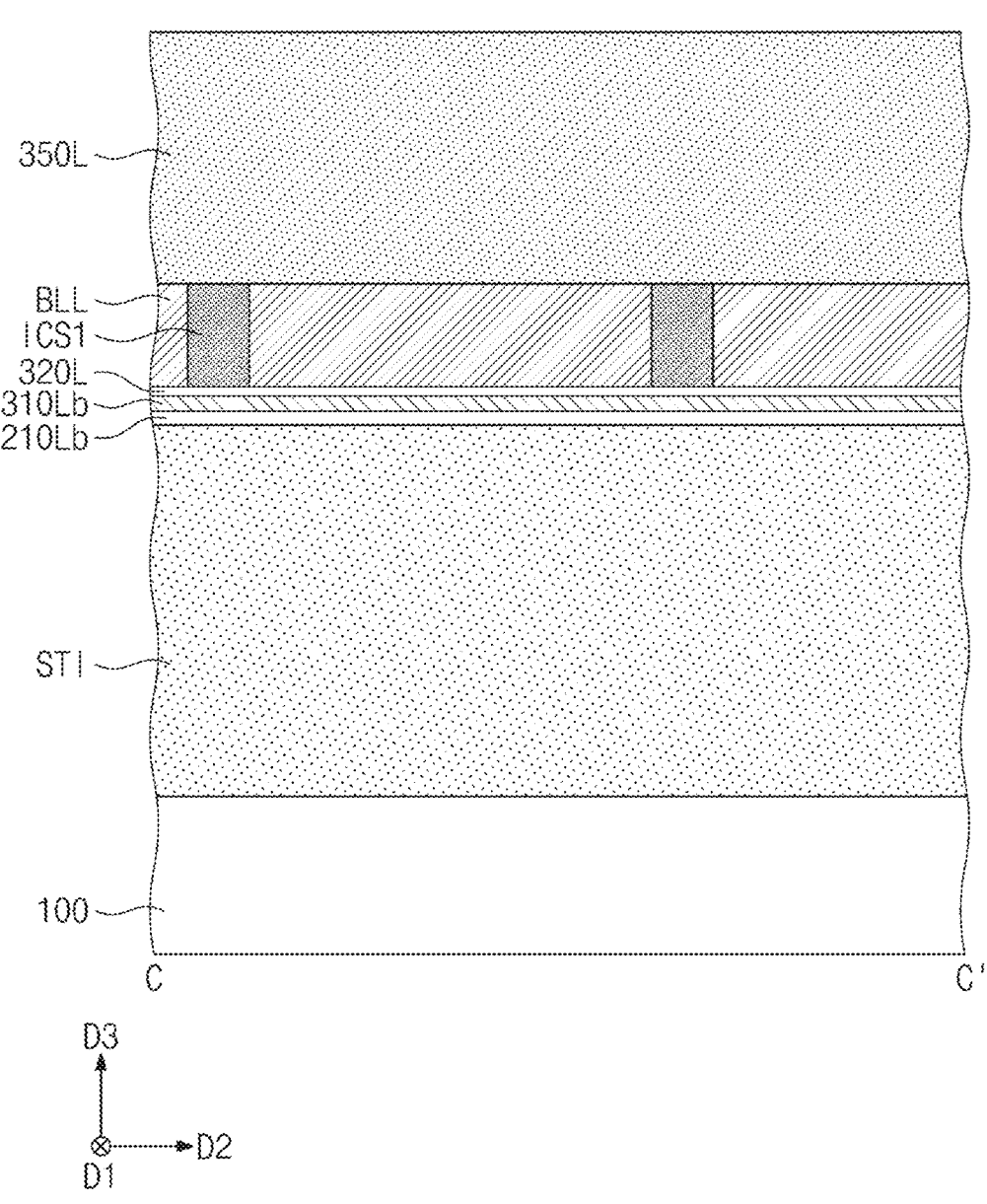
Figure 11A:
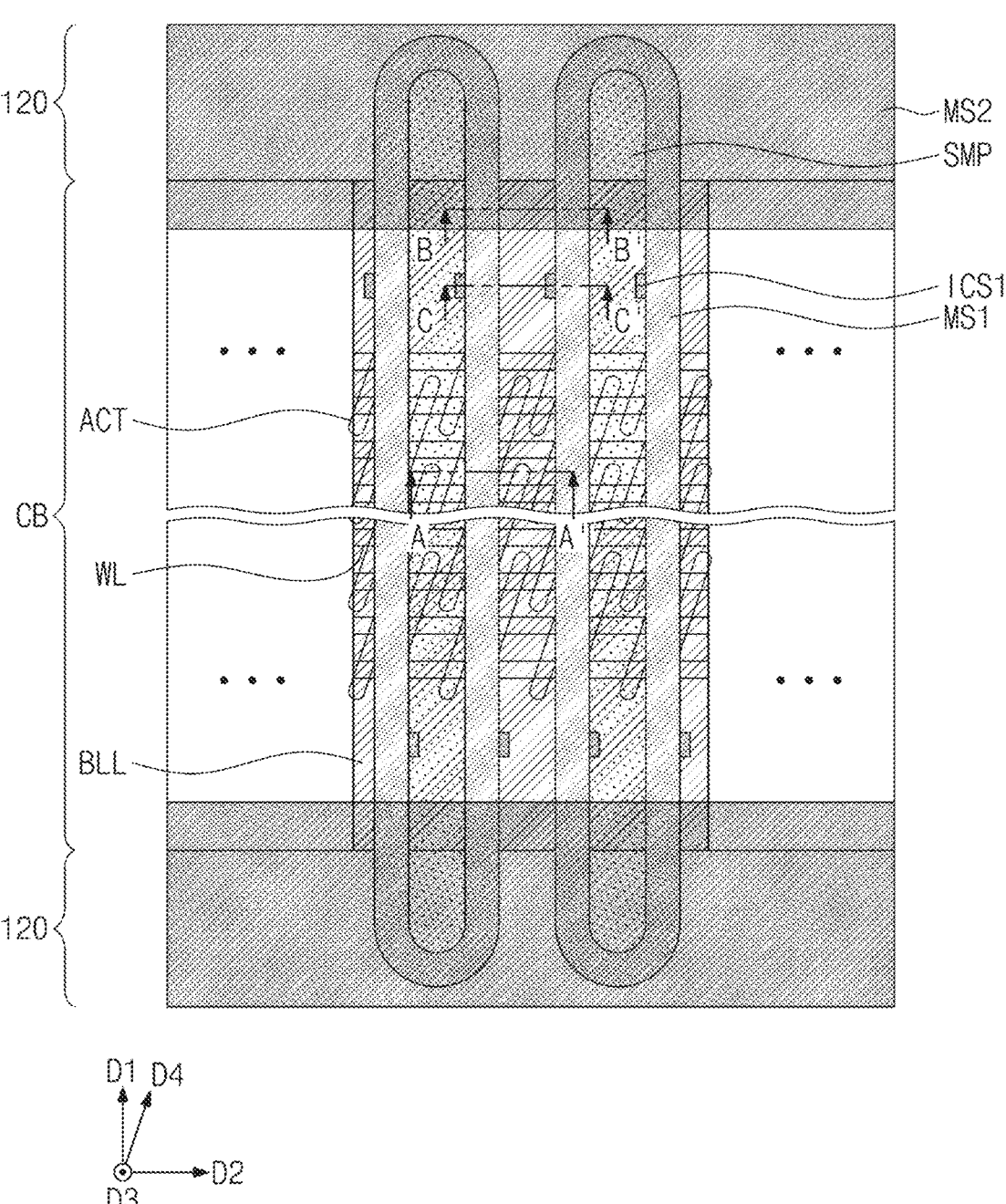
Figure 11B:
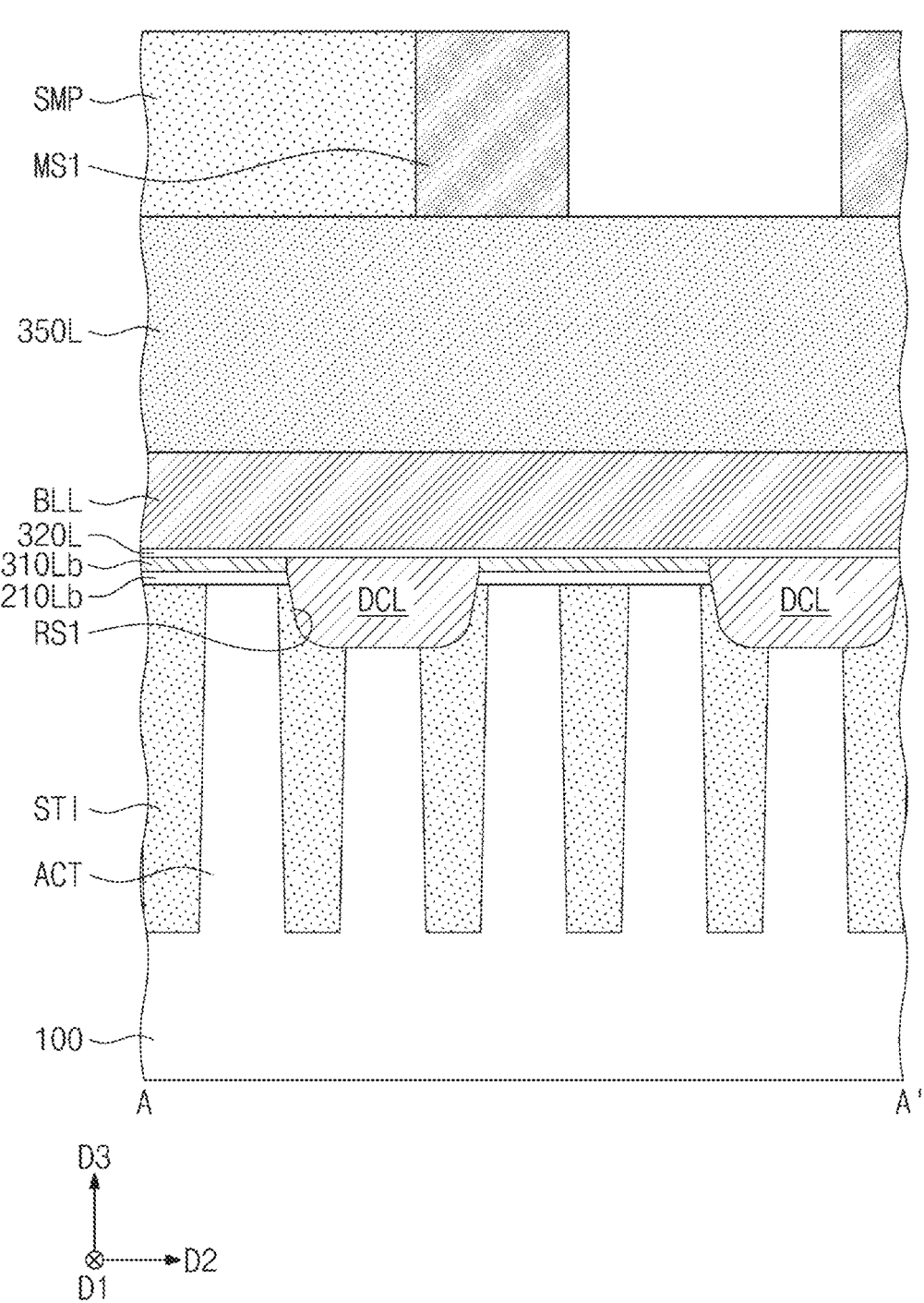
Figure 11C:
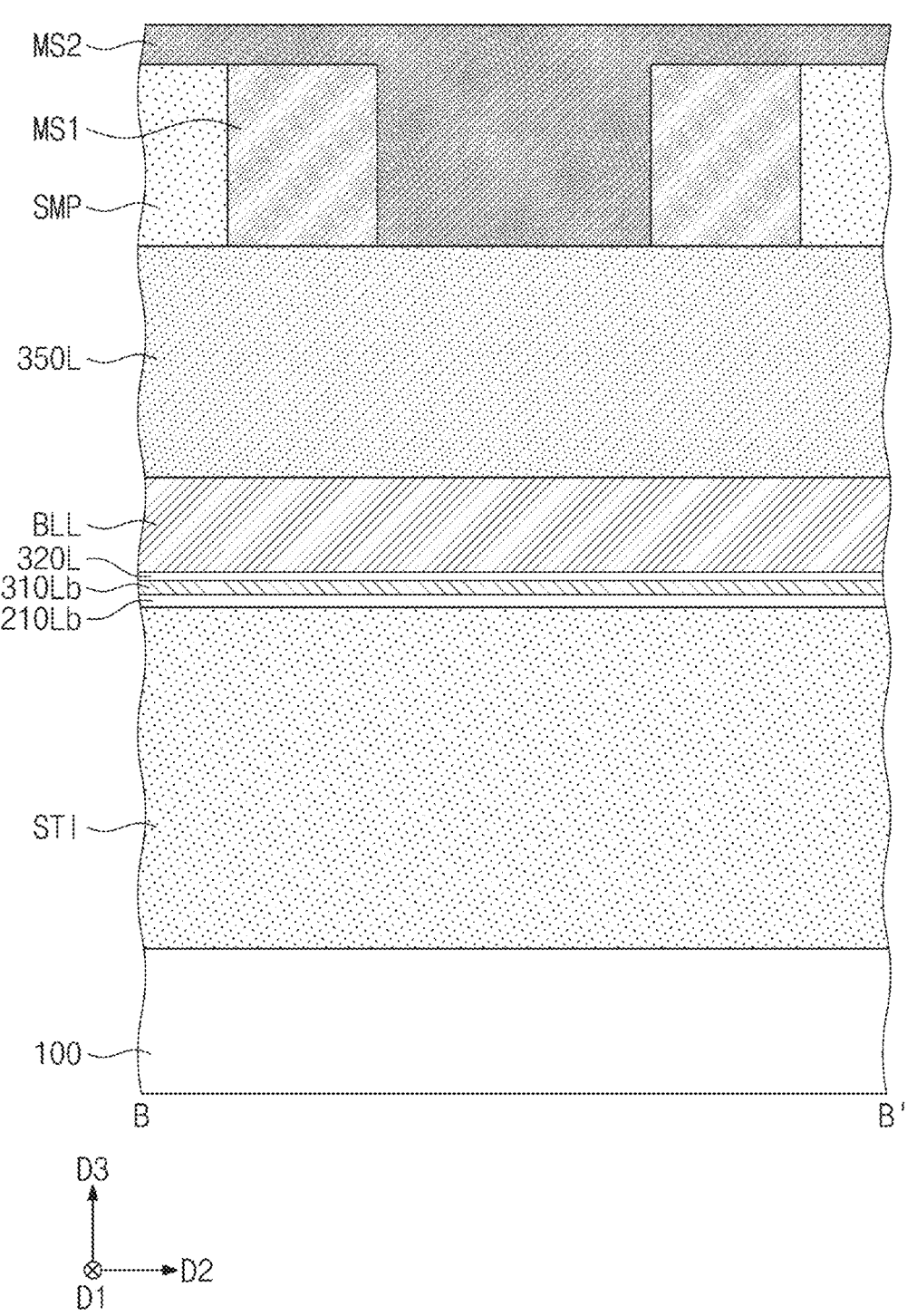
Figure 11D:
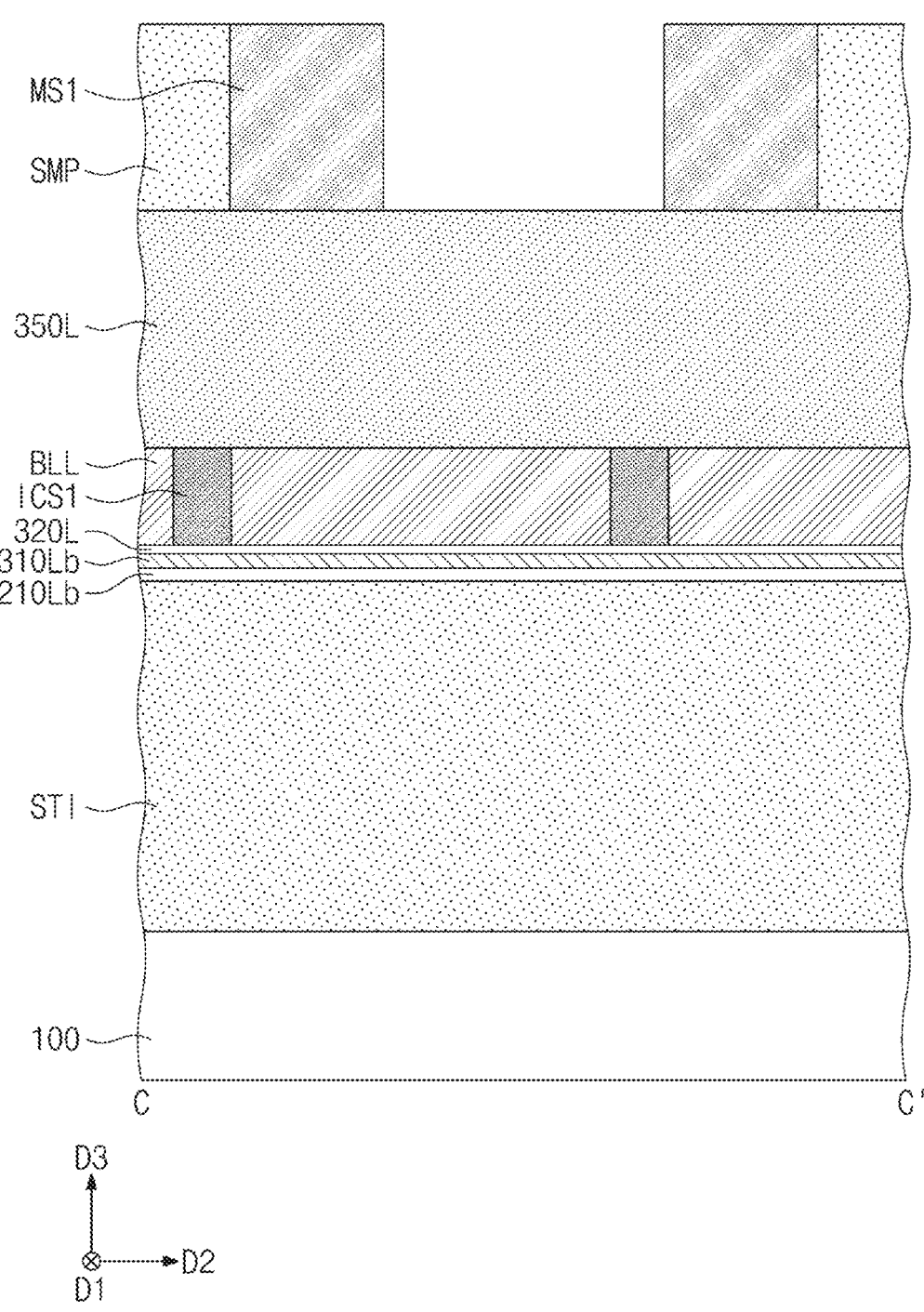
Figure 12A:
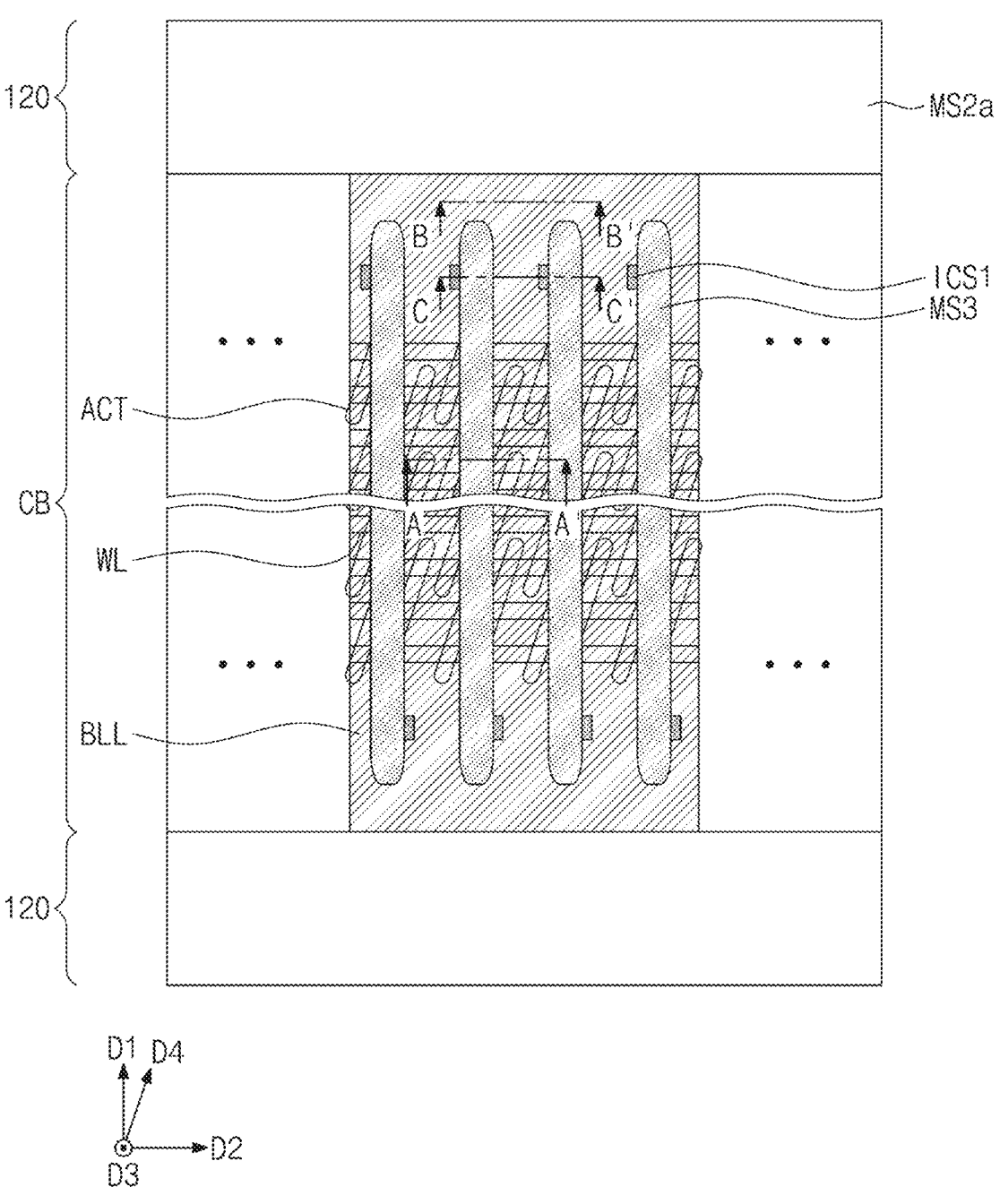
Figure 12B:
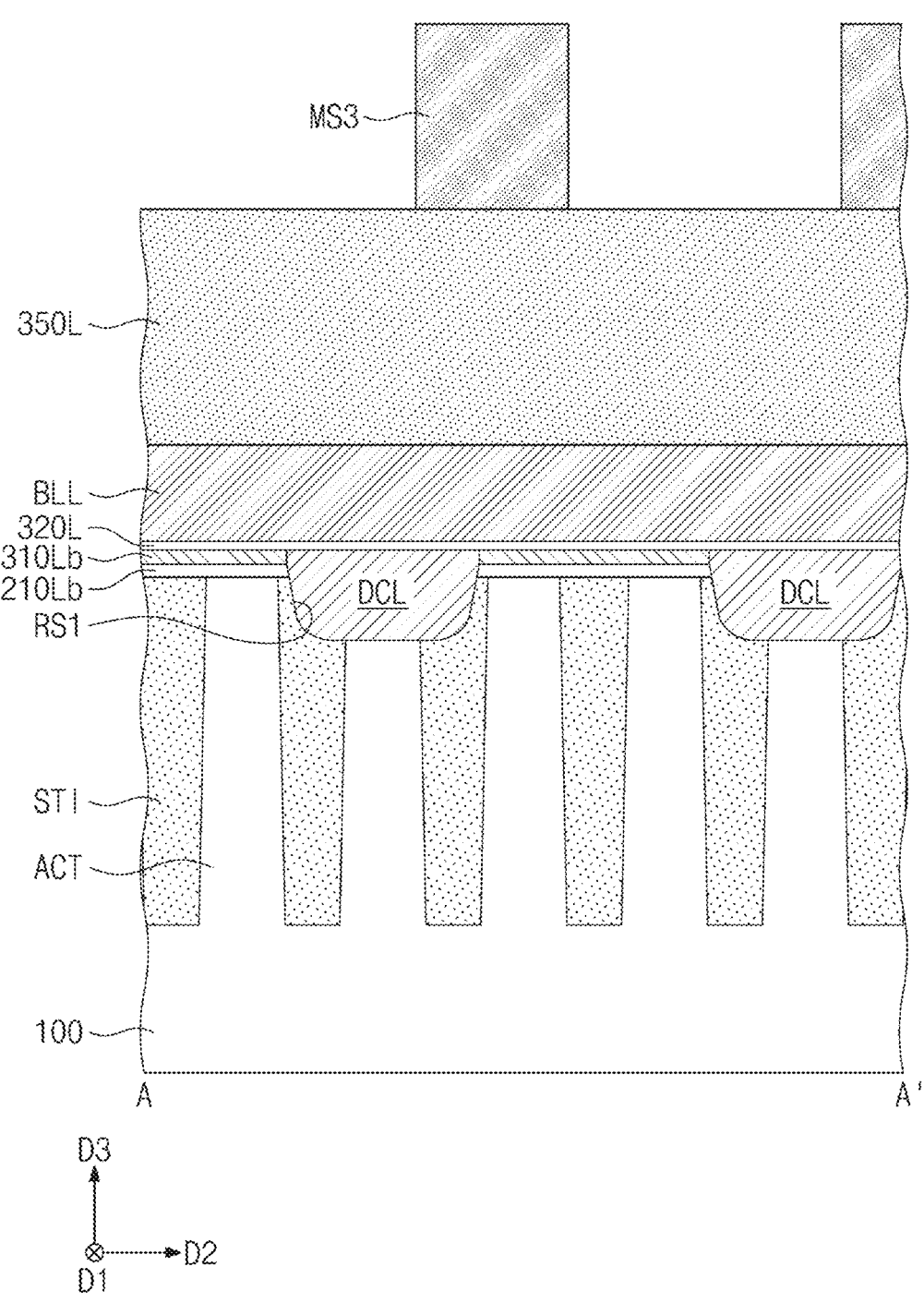
Figure 12C:
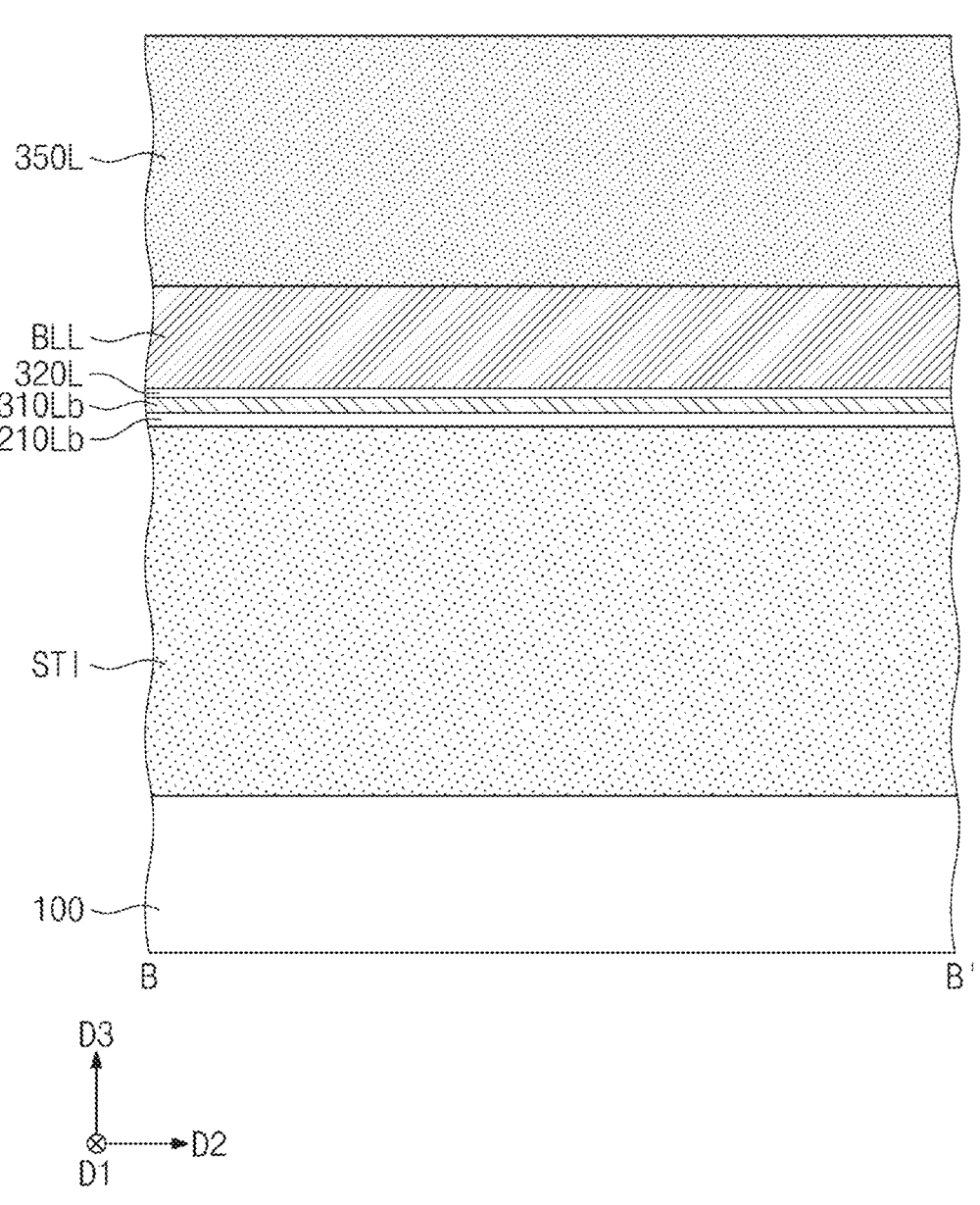
Figure 12D:
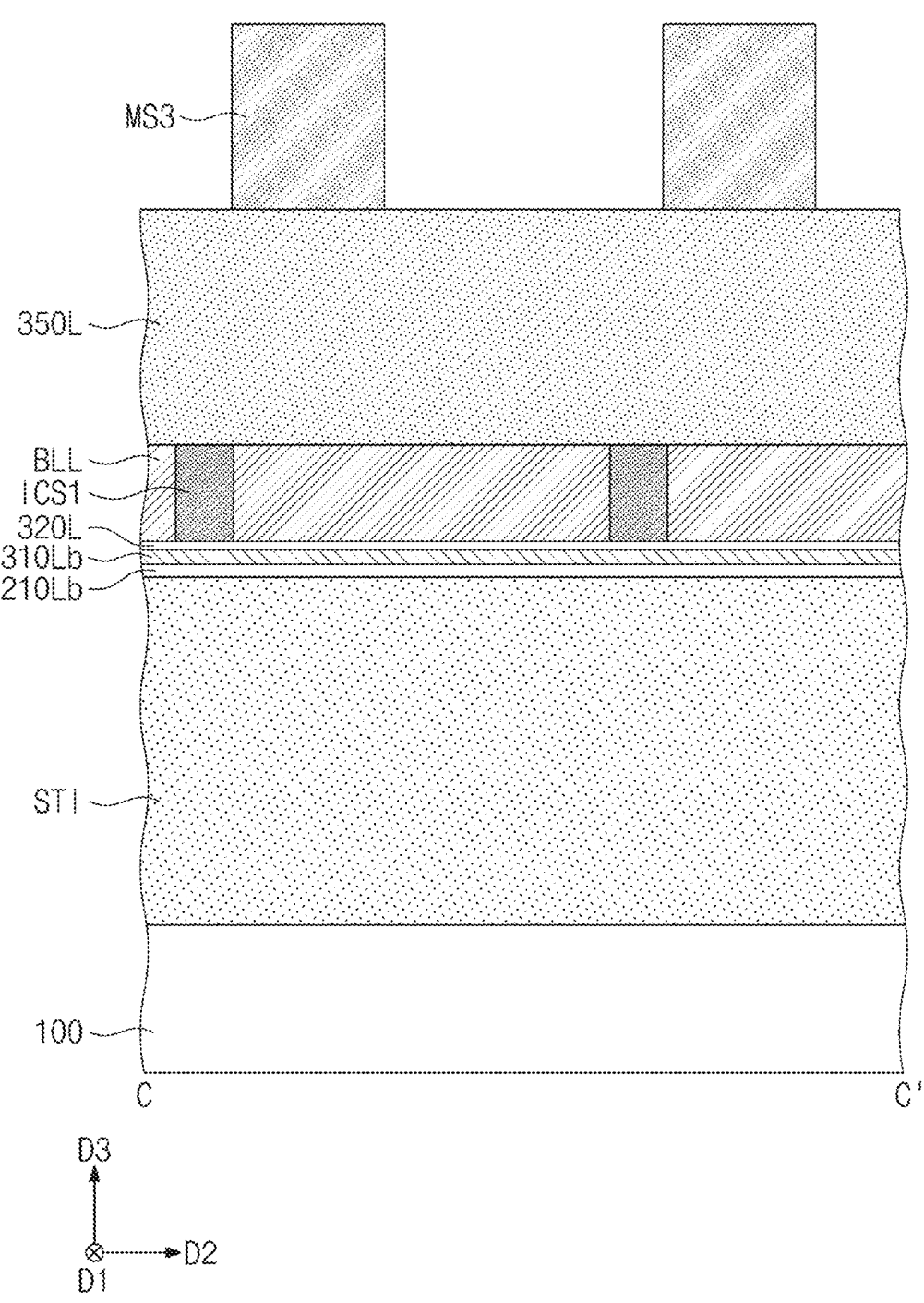
Figure 13A:
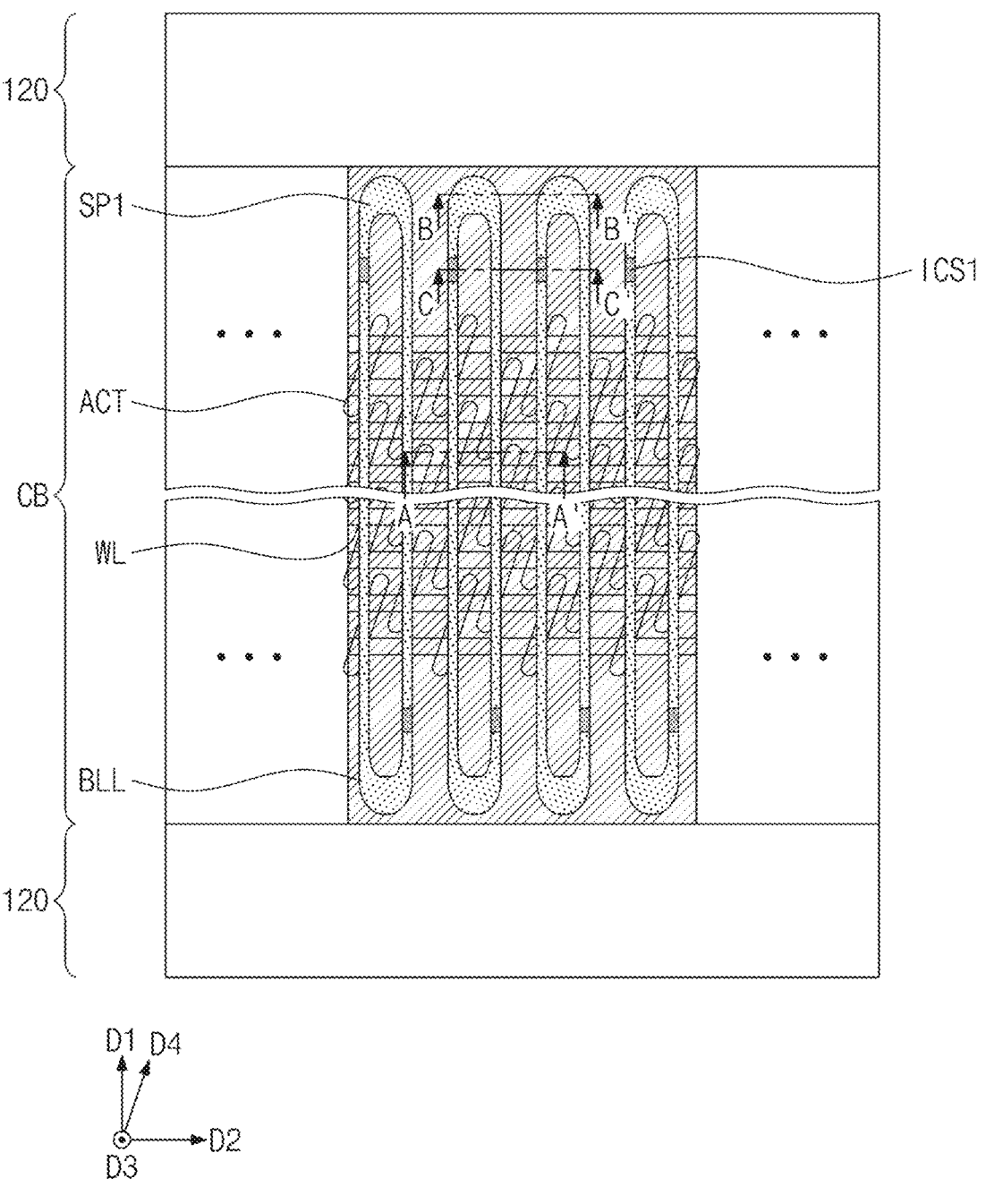
Figure 13B:
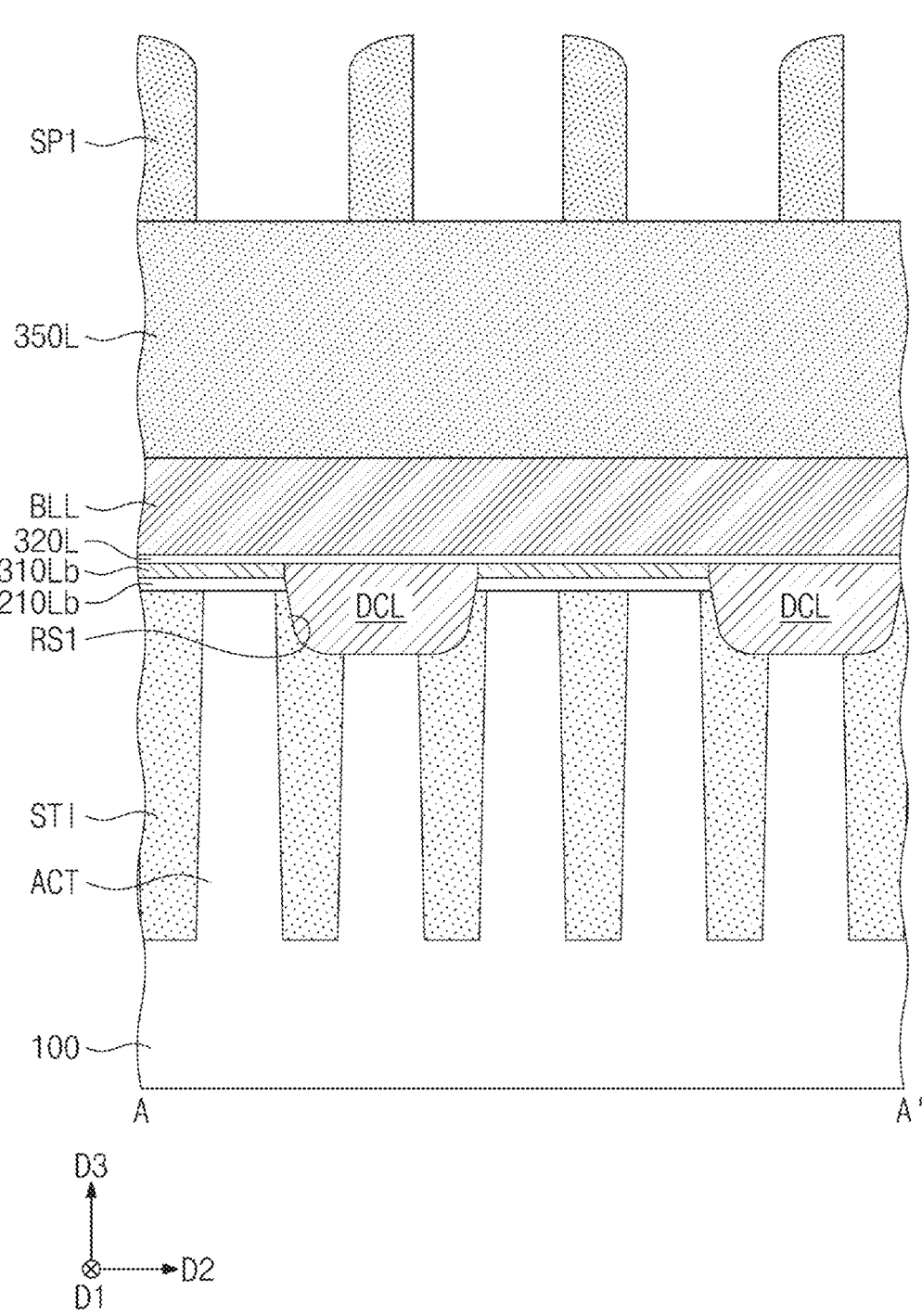
Figure 13C:
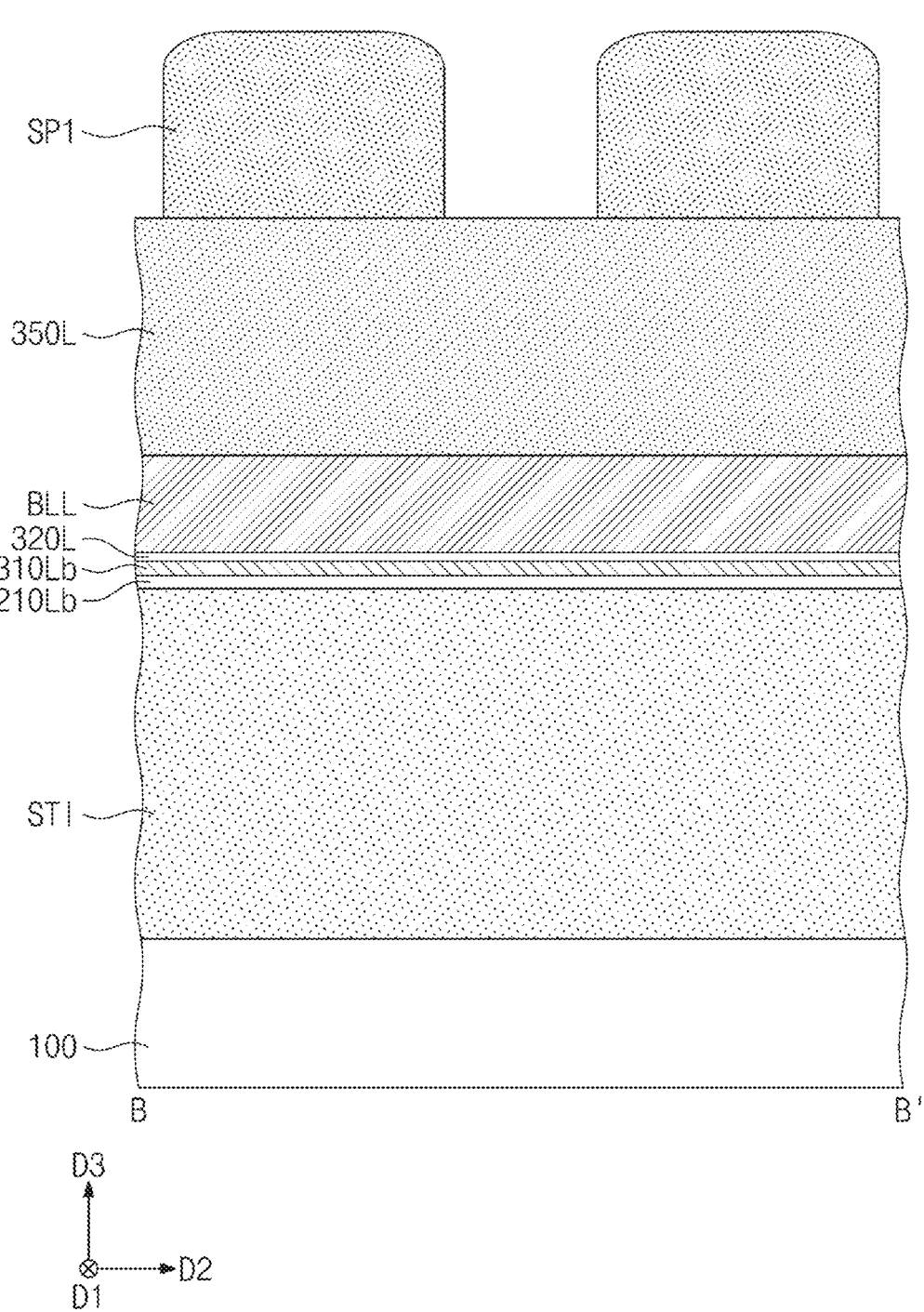
Figure 13D:
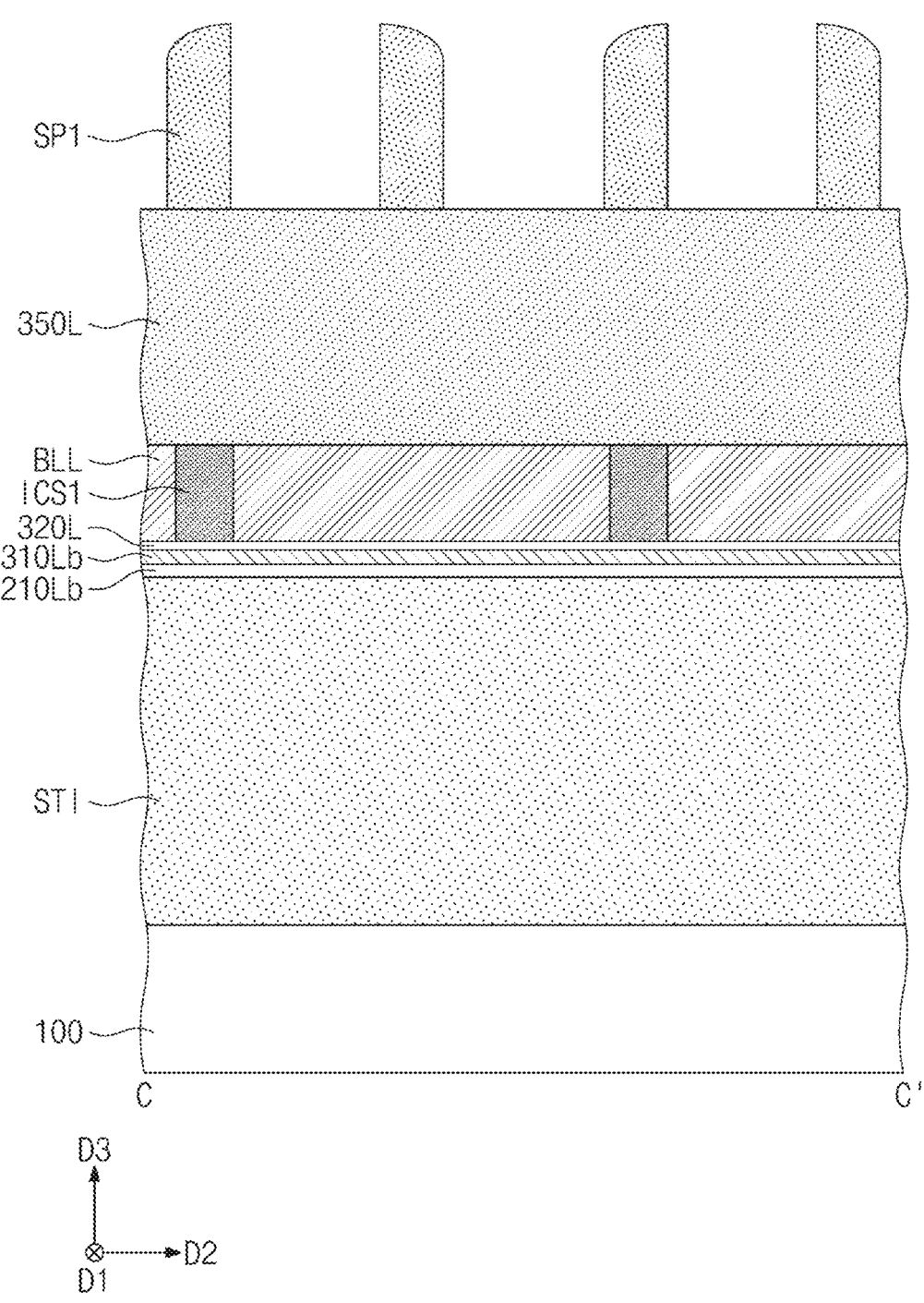
Figure 14A:
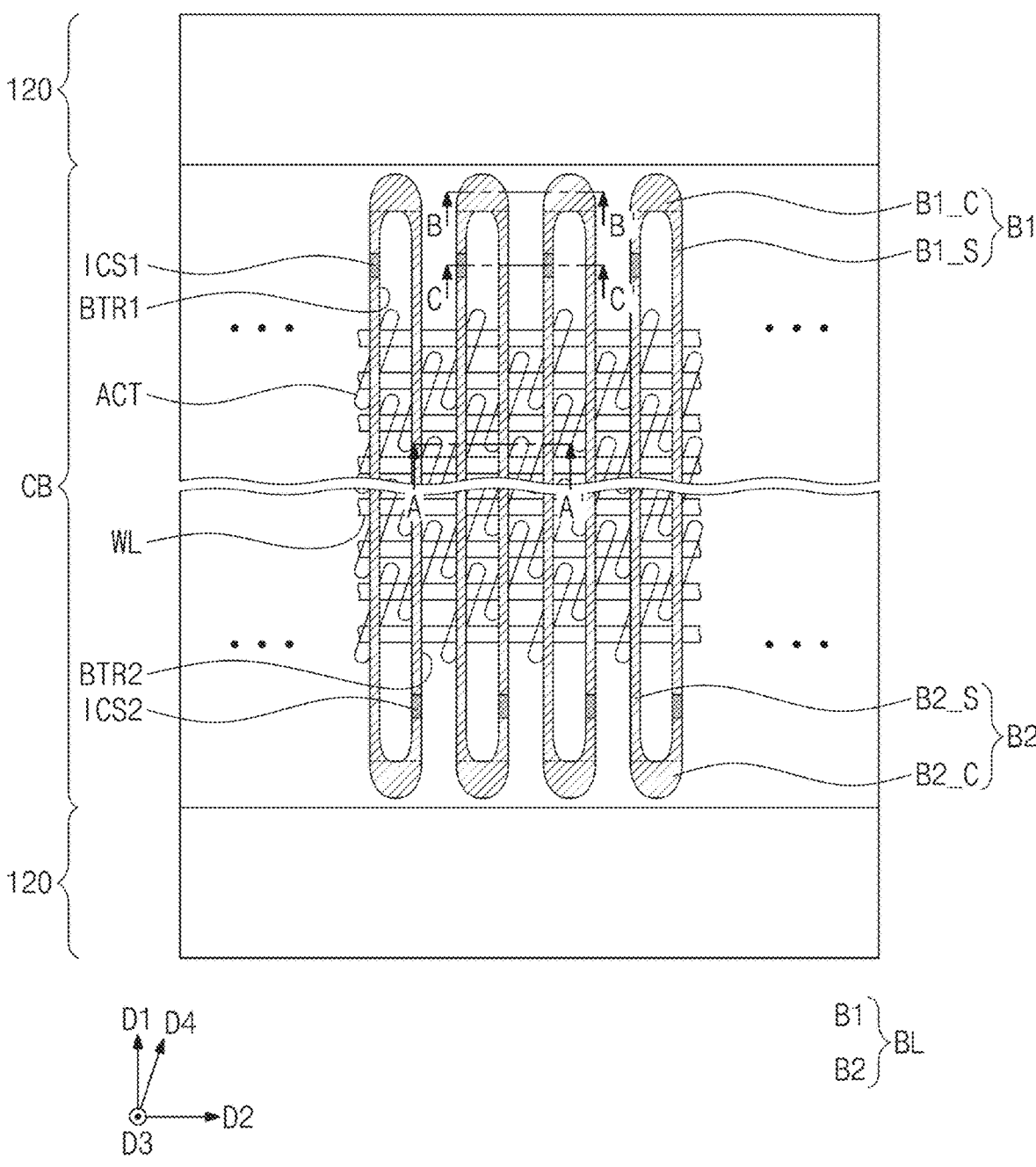
Figure 14B:
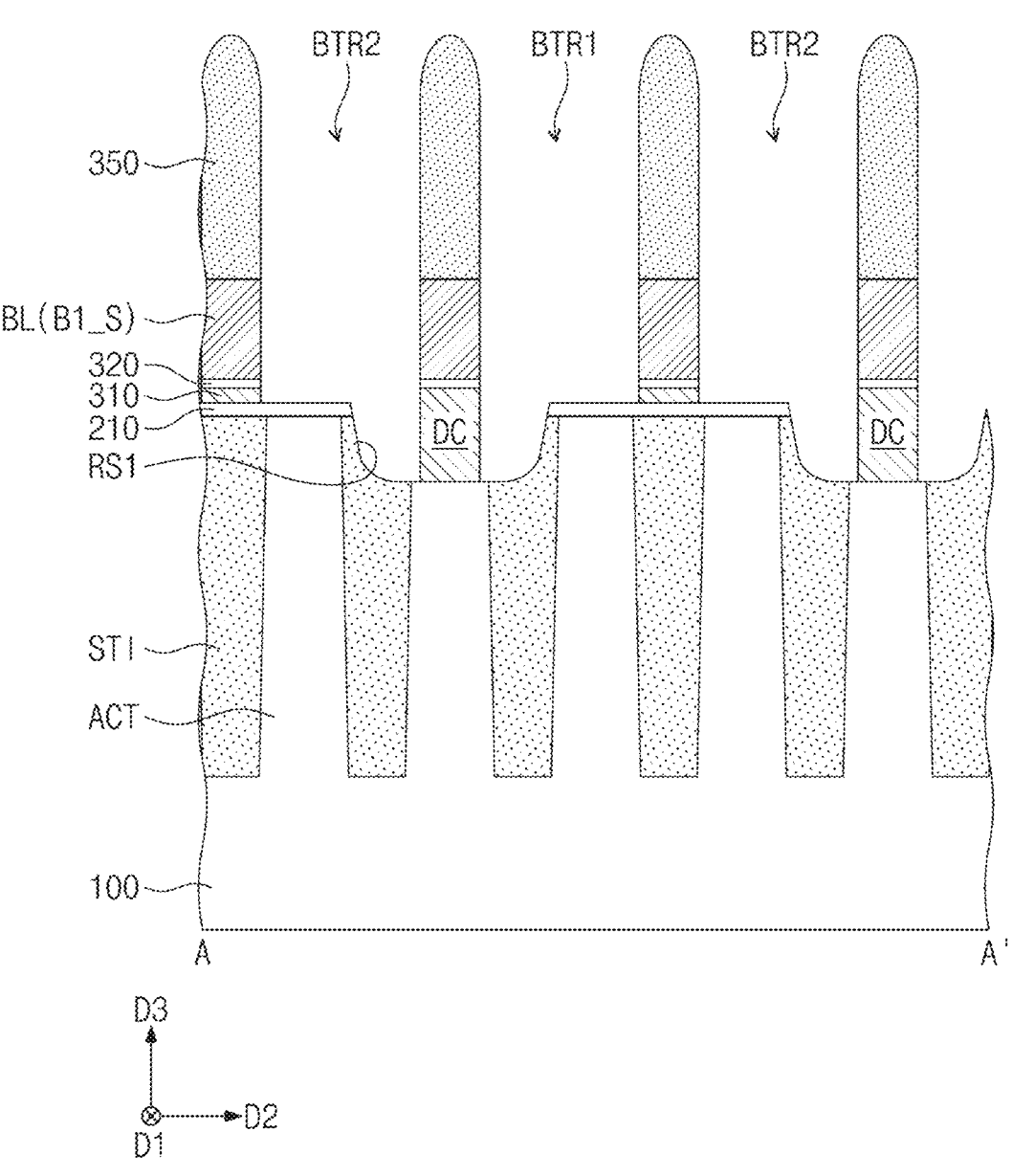
Figure 14C:
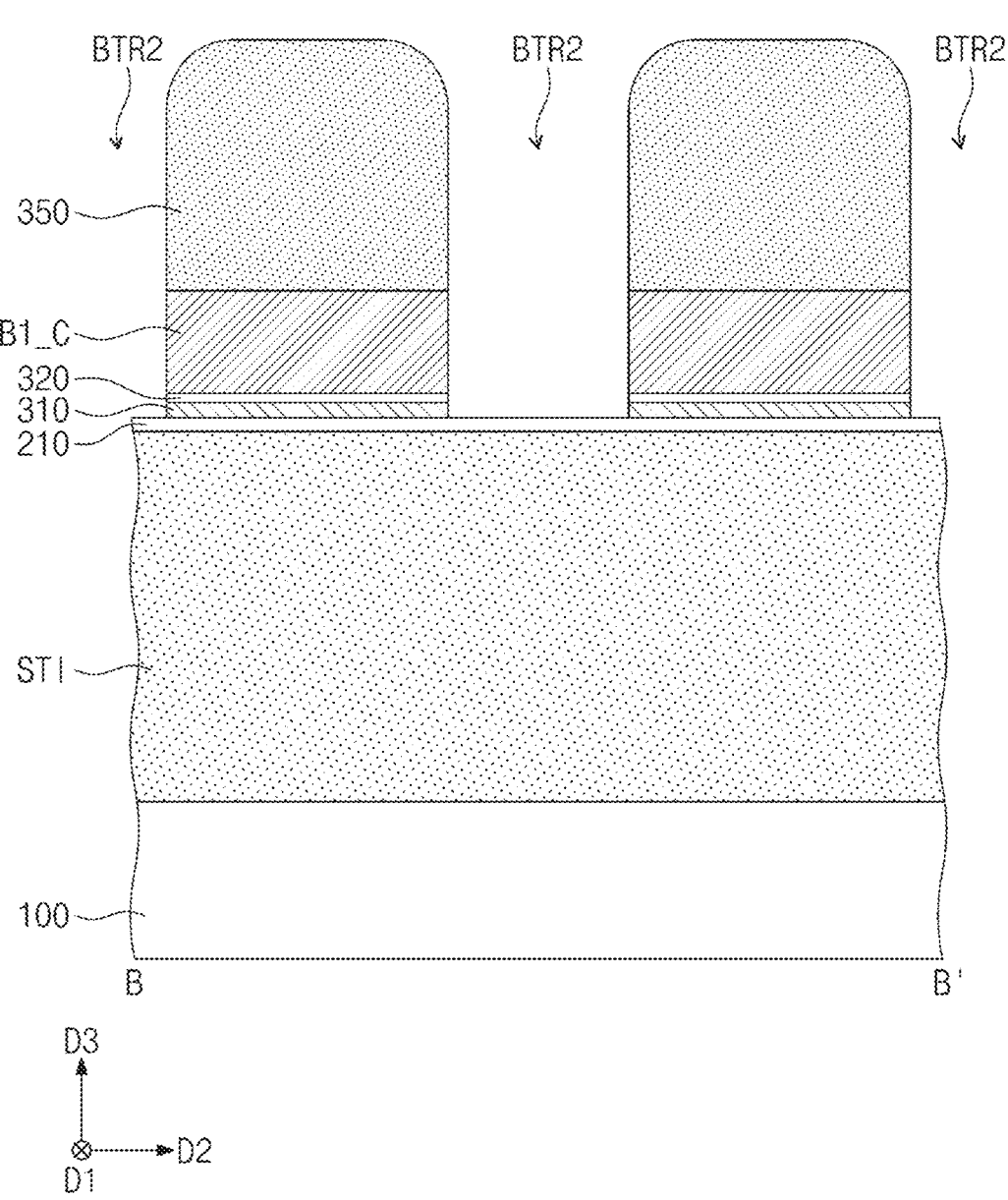
Figure 14D:
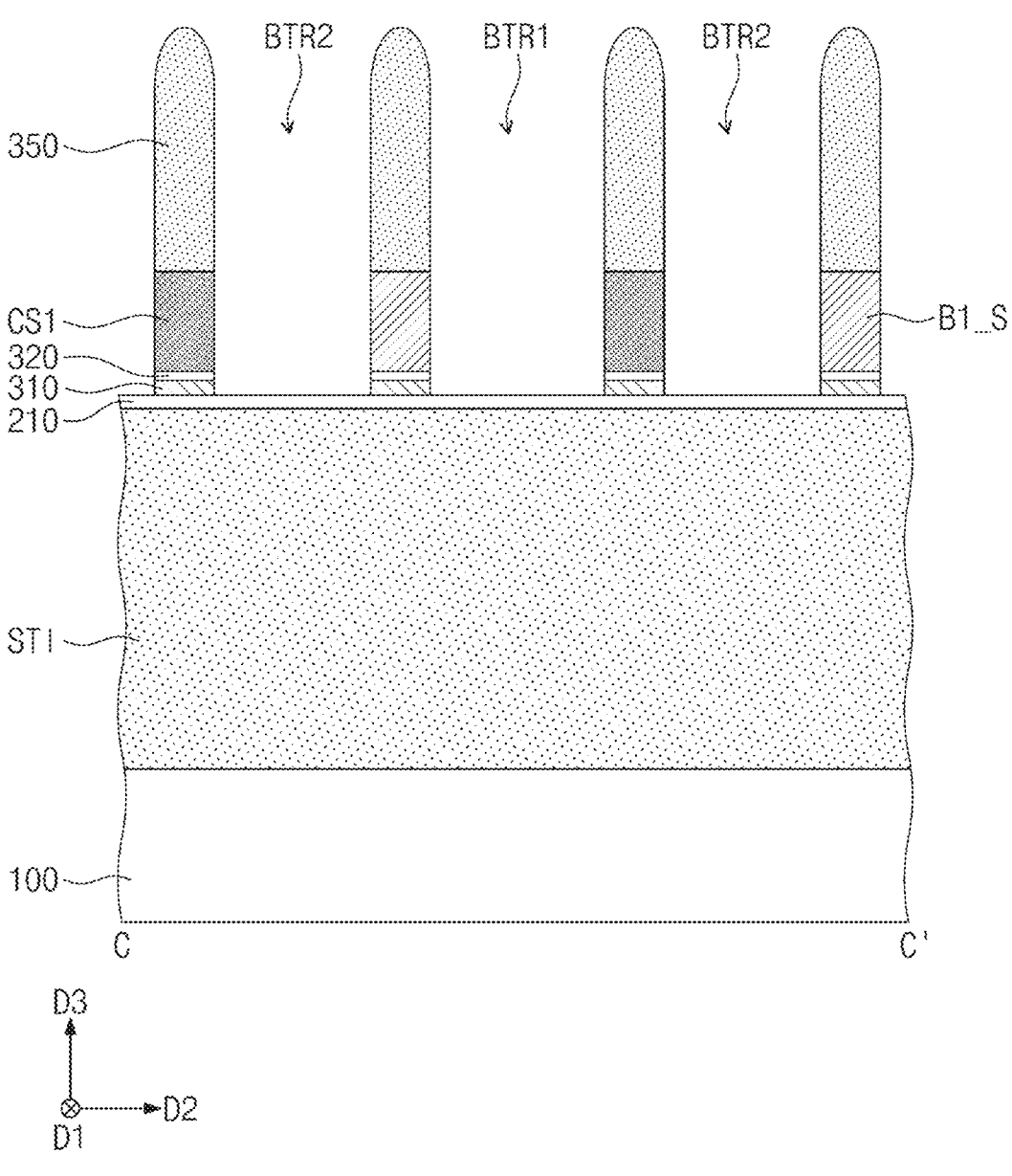
Figure 15A:
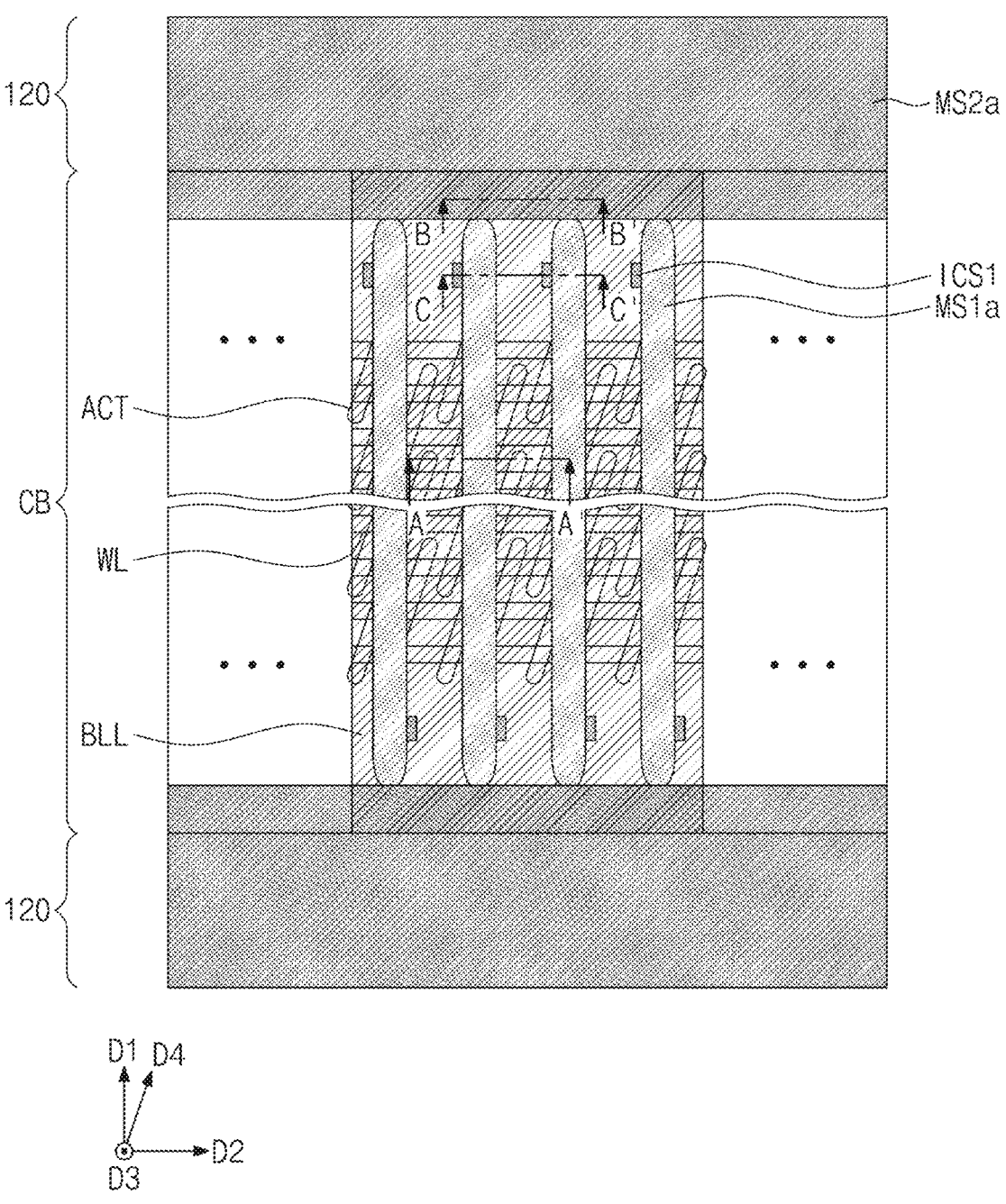
FIGS. 15A to 15D are diagrams illustrating a method of fabricating a semiconductor device, according to some example embodiments.
Figure 15B:
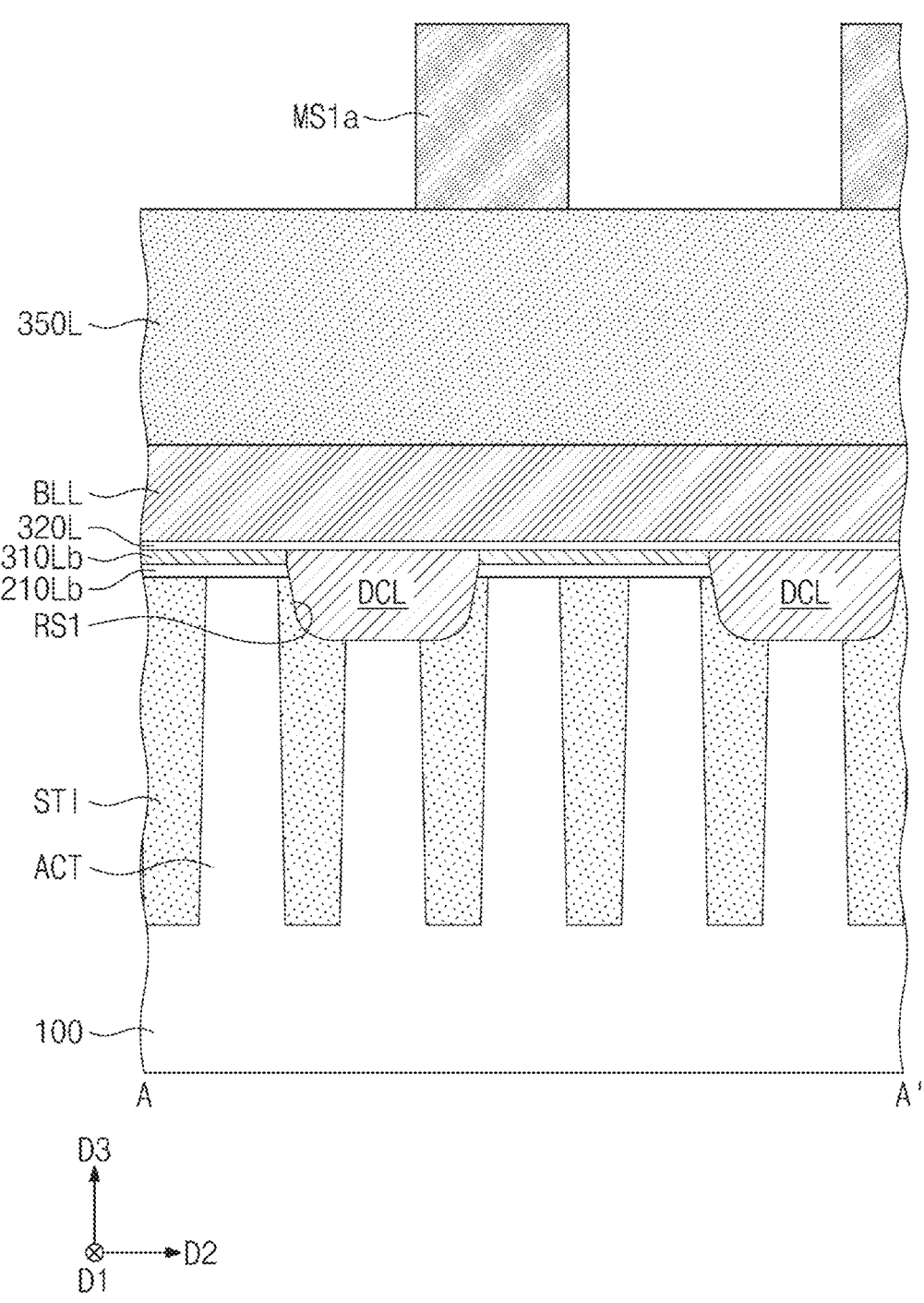
Figure 15C:
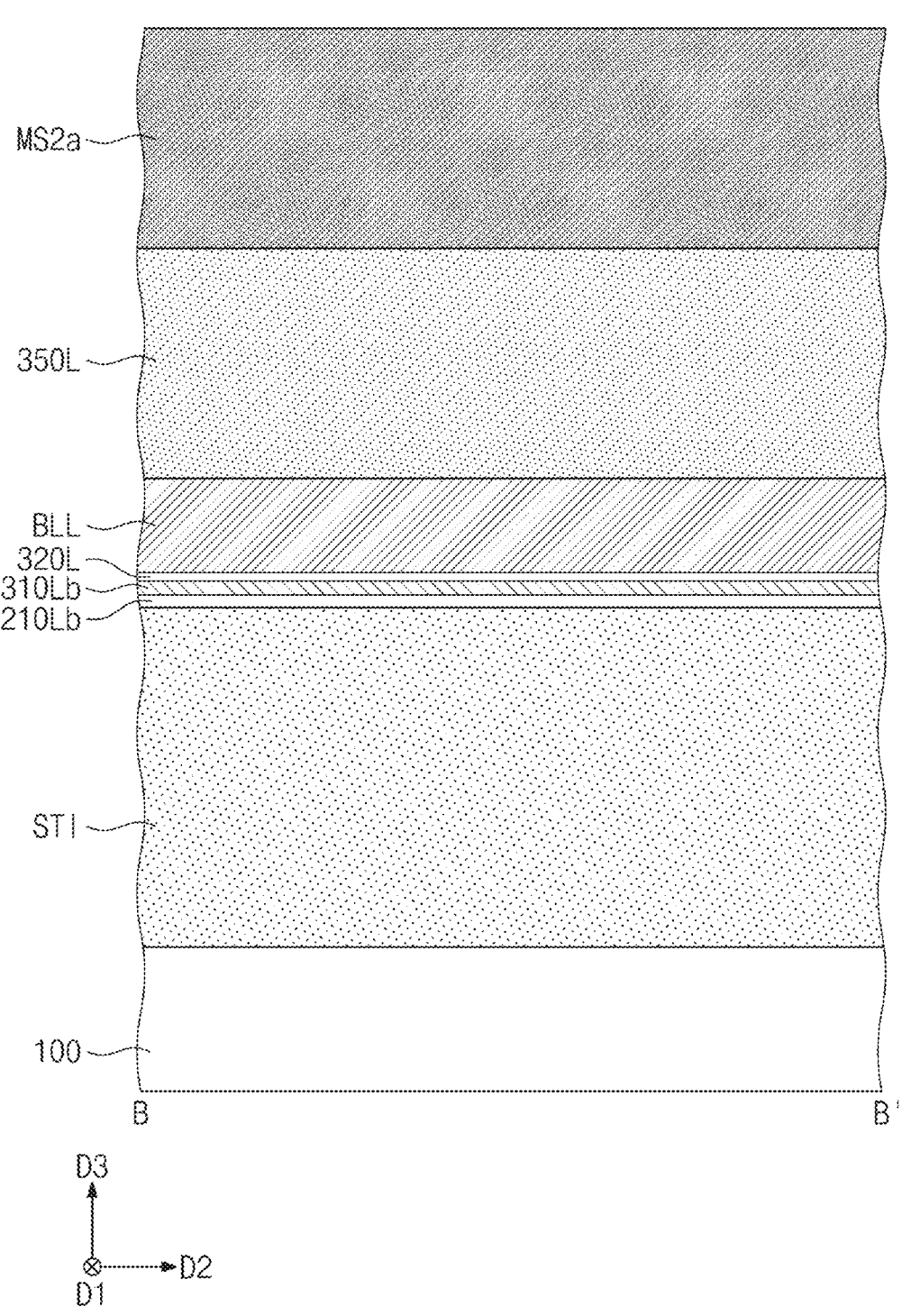
Figure 15D:
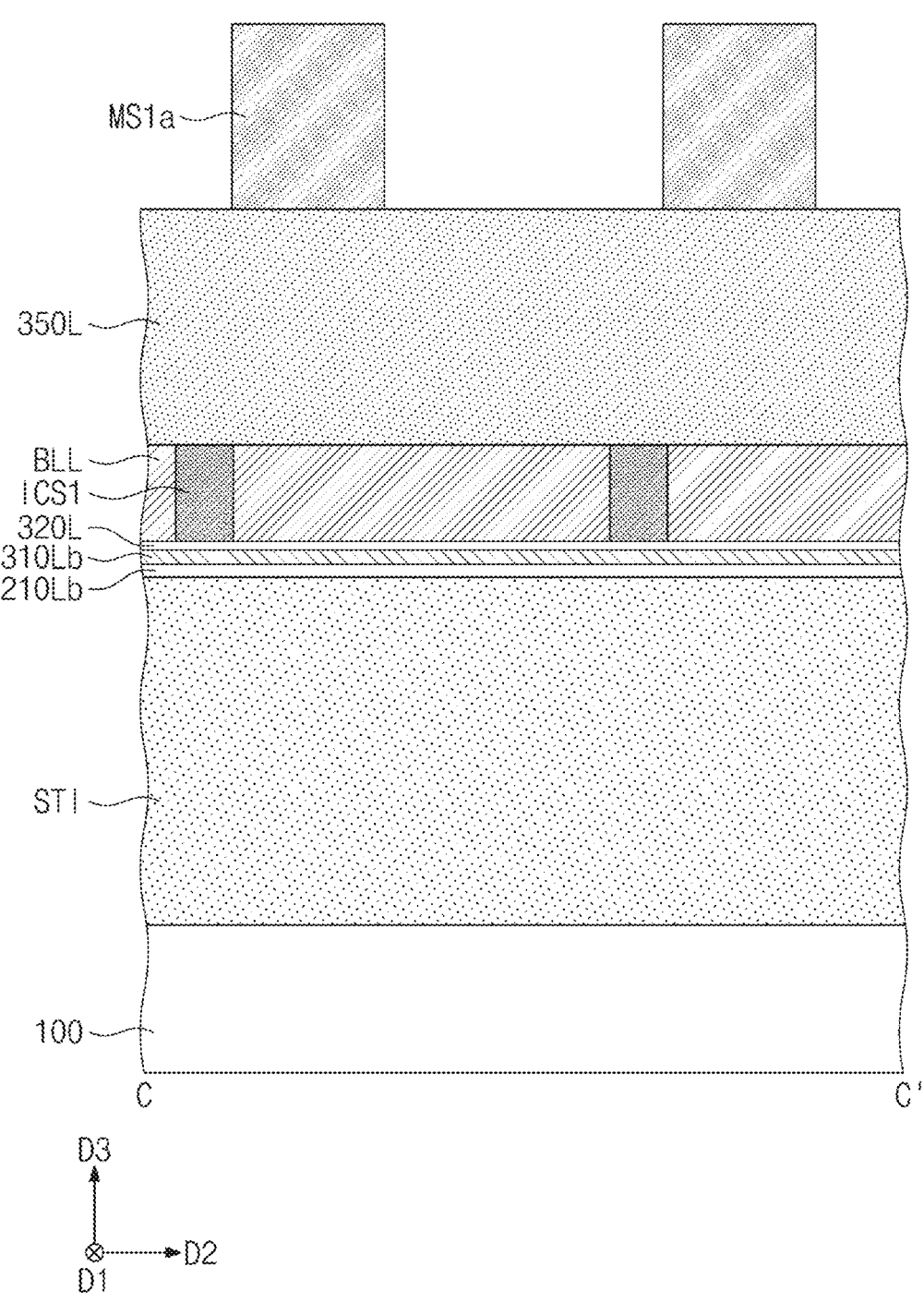

Referring to FIGS. 8A to 8C, the substrate 100 may be prepared, and in some example embodiments, the substrate 100 may include the cell block region CB and the peripheral region 120, which are adjacent to each other in the first direction D1.

The device isolation pattern STI and the active patterns ACT may be formed on the substrate 100. The formation of the device isolation pattern STI and the active pattern ACT may include performing a patterning process to form a trench region in the substrate 100 and filling the trench region with an insulating material to form the device isolation pattern STI. The active patterns ACT may be portions of the substrate 100 that are formed on the cell block region CB and have no trench region formed thereon.

The word lines WL may be formed on the cell block region CB. The word lines WL may be formed to cross the active patterns ACT and the device isolation pattern STI in the second direction D2. The formation of the word lines WL may include forming mask patterns on the active patterns ACT and the device isolation pattern STI, performing an anisotropic etching process, such as a dry etching process, using the mask patterns to form trench regions, and filling the trench regions with the word lines WL, with a process such as but not limited to a chemical vapor deposition (CVD) process and/or a physical vapor deposition (PVD) process. The word lines WL may be spaced apart from each other in the first direction D1. A pair of the word lines WL may be provided to cross the active pattern ACT.

A first buffer layer 210La and a first intervening pattern 310La may be formed on the cell block region CB. The first buffer layer 210La and the first intervening pattern 310La may cover a top surface of the active pattern ACT, a top surface of the device isolation pattern STI, and a top surface of the word line WL.

Referring to FIGS. 9A to 9D, the first recess region RS1 may be formed in an upper portion of the active pattern ACT. In some example embodiments, a plurality of first recess regions RS1 may be provided. The first recess regions RS1 may be spaced apart from each other in the first and second directions D1 and D2. The first recess region RS1 may be formed on the active pattern ACT. The formation of the first recess region RS1 may include performing an anisotropic etching process. As a result of the anisotropic etching process, a second buffer layer 210Lb and a second intervening pattern 310Lb may be formed from the first buffer layer 210La and the first intervening pattern 310La, respectively. The first recess region RS1 may be formed to expose a portion of the active pattern ACT and a portion of the device isolation pattern STI to the outside.

A preliminary bit line node contact DCL may be formed to fill the first recess region RS1. In some example embodiments, a plurality of preliminary bit line node contacts DCL may be provided. The preliminary bit line node contact DCL may be formed to have a top surface that is located at the same level as a top surface of the second intervening pattern 310Lb and is coplanar with the top surface of the second intervening pattern 310Lb. A first barrier layer 320L and a bit line layer BLL may be sequentially formed on the preliminary bit line node contact DCL and the second intervening pattern 310Lb.

First trenches TR1 may be formed to penetrate the bit line layer BLL in the third direction D3. A portion of the first barrier layer 320L may be exposed through the first trench TR1. The first trench TR1 may be formed to have the same size as the first insulating structure ICS1 to be formed in a subsequent step.

Referring to FIGS. 10A to 10D, the first and second insulating structures ICS1 and ICS2 may be formed by filling the first trenches TR1 with an insulating material. In some example embodiments, the formation of the first and second insulating structures ICS1 and ICS2 may include depositing an insulating material to fill the first trench TR1 and removing the insulating material from the top surface of the bit line layer BLL, and in this case, the first and second insulating structures ICS1 and ICS2 may be formed of only the insulating material filling the first trenches TR1. A bit line capping layer 350L may be formed on the bit line layer BLL and the first insulating structure ICS1.

Referring to FIGS. 11A to 11D, a first mask pattern MS1 and a spacer mask pattern SMP may be formed on the bit line capping layer 350L. A second mask pattern MS2 may be formed on the bit line capping layer 350L, the spacer mask pattern SMP, and the first mask pattern MS1. The first mask pattern MS1 may be formed along a side surface of the spacer mask pattern SMP.

The first mask pattern MS1 and the spacer mask pattern SMP may extend in the first direction D1, and the first mask patterns MS1 on the cell block region CB may be spaced apart from each other in the second direction D2. When viewed in a plan view, the first mask patterns MS1 may be provided to cross the active patterns ACT in the first direction D1. When viewed in a plan view, the spacer mask pattern SMP may be formed to cross the active patterns ACT in the first direction D1. When viewed in a plan view, the first mask patterns MS1 may be provided around the spacer mask pattern SMP.

The first mask patterns MS1 and the spacer mask pattern SMP may be formed on the cell block region CB and the peripheral region 120. The first mask pattern MS1 on the cell block region CB may extend in the first direction D1. The first mask patterns MS1, which are spaced apart from each other, may be connected to each other, on the peripheral region 120. The first mask patterns MS1, which are connected to each other on the peripheral region 120, may be provided to enclose the spacer mask pattern SMP.

The first mask pattern MS1 may not be overlapped with the first insulating structure ICS1. The first mask pattern MS1 may not be overlapped with the second insulating structure ICS2. The bit line capping layer 350L may be exposed to the outside, between the first mask patterns MS1. A portion of the first insulating structure ICS1 may be overlapped with the spacer mask pattern SMP. Another portion of the first insulating structure ICS1 may not be overlapped with the spacer mask pattern SMP. The description of the first insulating structure ICS1 may hold true of the second insulating structure ICS2.

In some example embodiments, the first mask patterns MS1 may be formed using a multi-patterning technology. The multi-patterning technology may include one or more of double patterning technologies (DPTs), such as a lithography-etch-lithography-etch (LELE) technology, a self-aligned double patterning (SADP) technology, and a self-aligned reverse patterning (SARP) technology, and quadruple patterning technologies (QPTs), such as a lithography-etch-lithography-etch-lithography-etch (LELELE) technology and a self-aligned quadruple patterning (SAQP) technology.

The second mask pattern MS2 may be formed on the peripheral region 120 and a portion of the cell block region CB. The second mask pattern MS2 may extend from the peripheral region 120 to the cell block region CB. The second mask pattern MS2 may be formed to cover a portion of the first mask pattern MS1. The second mask pattern MS2 on the peripheral region 120 may cover the first mask pattern MS1. The second mask pattern MS2 on the cell block region CB may cover the portion of the first mask pattern MS1 and expose the other portion.

Referring to FIGS. 12A to 12D, a third mask pattern MS3 may be formed.

The spacer mask pattern SMP may be removed from the cell block region CB exposed by the second mask pattern MS2, while the second mask pattern MS2 covers the first mask pattern MS1 and the spacer mask pattern SMP on the peripheral region 120 and a portion of the first mask pattern MS1 and a portion of the spacer mask pattern SMP on the cell block region CB.

A cell mask pattern (not shown) may be formed to cover the cell block region CB exposed by the second mask pattern MS2. The cell mask pattern may cover the first mask pattern MS1 and the bit line capping layer 350L, which are exposed by the second mask pattern MS2. The second mask pattern MS2, a portion of the first mask pattern MS1, and a remaining portion of the spacer mask pattern SMP may be removed using the cell mask pattern as an etch mask.

As a result of the removal of the spacer mask pattern SMP and the second mask pattern MS2, the third mask pattern MS3 may be formed. The third mask pattern MS3 may be formed on a first cell block region CB1. The third mask pattern MS3 may extend in the first direction D1 and may be spaced apart from each other in the second direction D2. When viewed in the first direction D1, an end portion of the third mask pattern MS3 may be spaced apart from the peripheral region 120 than an end portion of the bit line layer BLL. In some example embodiments, the third mask pattern MS3 may not be formed on the peripheral region 120. The end portion of the third mask pattern MS3 may include a curved portion.

Referring to FIGS. 13A to 13D, a first spacer SP1 may be formed. The formation of the first spacer SP1 may include forming a spacer mask layer (not shown) on the substrate 100 and etching the spacer mask layer to form the first spacer SP1 on a side surface of the third mask pattern MS3. The first spacer SP1 may be formed on the cell block region CB.

When viewed in a plan view, each of the first spacers SP1 may enclose a side surface of a corresponding one of the third mask patterns MS3. Each of the first spacers SP1 may enclose an end portion of each of the third mask patterns MS3, when viewed in the first direction D1. The end portions of the first spacer SP1 in the first direction D1 may be spaced apart from the peripheral region 120. In some example embodiments, the end portions of the first spacer SP1 in the first direction D1 may be rounded toward the peripheral region 120. The third mask pattern MS3 may be removed, after the formation of the first spacer SP1. The first spacer SP1 may be overlapped with the first and second insulating structures ICS1 and ICS2.

Referring to FIGS. 14A to 14D, an etching process may be performed using a peripheral mask pattern (not shown), which is formed on the first spacer SP1 and the peripheral region 120, as an etch mask. The bit line capping layer 350L, the bit line layer BLL, the first barrier layer 320L, the second intervening pattern 310Lb, and the preliminary bit line node contact DCL may be etched by the etching process, and the bit line capping pattern 350 and the bit line BL may be formed.

In some example embodiments, the bit line BL may be formed to have a profile similar to the first spacer SP1. The first and second bit line trench regions BTR1 and BTR2 may be formed between the bit line capping patterns 350 and between the linear portions B1_S of the bit lines BL. The second bit line trench regions BTR2 may be formed between the curved portions B1_C of the bit lines BL.

Since the etching process is performed using the first spacer SP1 as an etch mask, the first and second insulating structures ICS1 and ICS2 may be overlapped with the bit line capping pattern 350, and thus the first and second insulating structures ICS1 and ICS2 may be unetched and left below the bit line capping patterns 350.

Owing to the peripheral mask pattern (not shown), it may be possible to prevent or reduce the likelihood of and/or the impact from peripheral patterns, such as peripheral word lines (not shown), on the peripheral region 120 from being etched and/or removed during the etching process.

Referring back to FIGS. 1 to 5, the inner spacer IS may be formed on the inner side surface BL_I of the bit line BL, and the outer spacer OS may be formed on the outer side surface BL_O of the bit line BL. The inner spacer IS may be formed in the first bit line trench region BTR1, and the outer spacer OS may be formed in the second bit line trench region BTR2. In some example embodiments, the gapfill insulating pattern 250 may be formed to fill the first recess region RS1, during the formation of the inner and outer spacers IS and OS. The formation of the inner and outer spacers IS and OS may include sequentially forming a plurality of sub-spacers on the side surfaces of the bit lines BL.

The second recess region RS2 may be formed on the active pattern ACT. The formation of the second recess region RS2 may include removing a portion of a buffer layer 210L, which is placed on the active pattern ACT, to form the buffer pattern 210.

The storage node contact BC may be formed to fill the second recess region RS2. In the second recess region RS2, the storage node contact BC may be electrically connected to the active pattern ACT. The formation of the storage node contact BC may include forming a storage node contact layer (not shown) to fill the second recess region RS2 and removing an upper portion of the storage node contact layer to form the storage node contacts BC, which are spaced apart from each other. The removal of the upper portion of the storage node contact layer may further include performing an etch-back and/or polishing process, but inventive concepts are not limited to this example.

A fence pattern (not shown) may be formed on the word lines WL, before or after the formation of the storage node contact BC. The fence pattern may be formed to separate the storage node contacts BC from each other in the first direction D1.

The landing pads LP may be formed on the storage node contacts BC. The formation of the landing pads LP may include sequentially forming a landing pad layer (not shown) and mask patterns (not shown) to cover top surfaces of the storage node contacts BC and dividing the landing pad layer into the landing pads LP through an anisotropic etching process using the mask patterns as an etch mask.

The contact plug CP may be formed on the curved portion B1_C of the bit line BL and the bit line capping pattern 350. The contact plug CP may be formed to penetrate the bit line capping pattern 350. The formation of the contact plug CP may include forming a contact hole on the curved portion B1_C of the bit line BL and the bit line capping pattern 350, forming a contact plug layer to fill the contact hole, and etching the contact plug layer to form the contact plug CP. In some example embodiments, the contact plug layer may be formed together with the landing pad layer.

Thereafter, the filler pattern 440 may be formed in the etched region of the landing pad layer and the etched region of the contact plug layer. The filler pattern 440 may be formed to cover exposed portions of the landing pads LP and the contact plugs CP and to enclose each of them. The data storage pattern DSP may be formed on the landing pads LP, respectively. The contact lines CL may be formed on the contact plug CP.

FIGS. 15A to 15D are diagrams illustrating a method of fabricating a semiconductor device, according to some example embodiments of inventive concepts.

FIGS. 15A to 15D illustrate other example embodiments of the fabrication method of FIGS. 11A to 11D. Referring to FIGS. 15A to 15D, a first mask MS1*a* and a second mask MS2*a* may be formed after the formation of the first and second insulating structures ICS1 and ICS2 and the bit line capping layer 350L described with reference to FIGS. 10A to 10D.

The first mask MS1*a* may be formed on a region that is not covered with the second mask MS2*a*. The second mask MS2*a* may be formed on the peripheral region 120 and a portion of the cell block region CB, which is exposed through the first mask MS1*a*. The second mask MS2*a* may extend from the peripheral region 120 to the cell block region CB.

The first mask MS1a may be formed on the cell block region CB. The first masks MS1a may extend in the first direction D1 and may be spaced apart from each other in the second direction D2. When viewed in the first direction D1, an end portion of each of the first mask MS1a may be formed to be farther spaced apart from the peripheral region 120 than the end portion of the bit line layer BLL. As an example, the first mask MS1a may not be formed on the peripheral region 120. The end portion of the first mask MS1a may include a curved portion.

The end portion of the first mask MS1a may be in contact with the end portion of the second mask MS2a. The first and second masks MS1a and MS2a may not be overlapped with the first insulating structure ICS1. The first and second masks MS1a and MS2a may not be overlapped with the second insulating structure ICS2.

The second mask MS2a may be removed, after the formation of the first mask MS1a. The fabrication process described with reference to FIGS. 12A to 14D may be performed to fabricate a semiconductor device, after the removal of the second mask MS2a.

According to some example embodiments of inventive concepts, a bit line may include a curved portion and a linear portion and an intervening portion, which are connected to the curved portion, and an insulating structure may be interposed between the intervening and linear portions of the bit line. Since a contact plug is connected to the curved portion of the bit line, it may be possible to increase an integration density of the semiconductor device and/or facilitate a fabrication process. Alternatively or additionally, by forming the bit line through a multi-patterning technique, it may be possible to improve the productivity in a fabrication process.

Alternatively or additionally, an inner spacer and an outer spacer may be formed to enclose a bit line structure, and in this case, it may be possible to minimize or reduce an electrical interference issue such as neighboring bit line capacitance between the bit line structure and neighboring conductive patterns.

While various example embodiments of inventive concepts have been particularly shown and described, it will be understood by one of ordinary skill in the art that variations in form and detail may be made therein without departing from the spirit and scope of the attached claims. Furthermore example embodiments are not necessarily mutually exclusive with one another. For example, some example embodiments may include one or more features described with reference to one or more figures, and may also include one or more other features described with reference to one or more other figures.

What is claimed is:

1. A semiconductor device, comprising:
a substrate including a cell block region and a peripheral region, which are adjacent to each other in a first direction;
an active pattern on the cell block region;
a bit line on the active pattern and extending in the first direction;
a first insulating structure in contact with the bit line; and
a contact plug electrically connected to the bit line,
wherein, as seen in plan view, the bit line comprises a first curved portion, a first linear portion connected to a side of the first curved portion, and a first intervening portion having a first end connected to the side of the first curved portion and a second end connected to an end of the first insulating structure, and
the contact plug overlaps with the first curved portion.

2. The semiconductor device of claim 1, wherein a width of the first curved portion is larger than a width of the first linear portion.

3. The semiconductor device of claim 1, wherein a top surface of the first insulating structure is coplanar with a top surface of the bit line.

4. The semiconductor device of claim 1, wherein
the bit line further comprises a second curved portion, a second intervening portion connected to the second curved portion, and a second linear portion connected to the second curved portion, and
the first insulating structure is interposed between the first intervening portion and the second linear portion.

5. The semiconductor device of claim 4, wherein
the active pattern comprises a first active pattern and a second active pattern, which are spaced apart from each other in a second direction crossing the first direction,
the first linear portion vertically overlaps with the first active pattern, and
the second linear portion vertically overlaps with the second active pattern.

6. The semiconductor device of claim 4, further comprising:
a second insulating structure interposed between the second intervening portion and the first linear portion.

7. The semiconductor device of claim 1, further comprising:
a bit line capping pattern on the bit line,
wherein the contact plug penetrates the bit line capping pattern and is connected to the first curved portion of the bit line.

8. The semiconductor device of claim 1, wherein a width of the first insulating structure is equal to a width of the first linear portion of the bit line.

9. The semiconductor device of claim 1, further comprising:
an outer spacer on an outer side surface of the bit line; and
an inner spacer on an inner side surface of the bit line,
wherein the contact plug is interposed between the outer spacer and the inner spacer.

10. A semiconductor device, comprising:
a substrate including a cell block region and a peripheral region, which are adjacent to each other in a first direction;
an active pattern on the cell block region;
a bit line on the active pattern and extending in the first direction;
a first insulating structure in contact with the bit line; and
a contact plug electrically connected to the bit line,
wherein a top surface of the bit line is coplanar with a top surface of the first insulating structure,
wherein, as seen in plan view, the bit line comprises a first curved portion, a first linear portion connected to a side of the first curved portion, and a first intervening portion having a first end connected to the side of the first curved portion and a second end connected to an end of the first insulating structure.

11. The semiconductor device of claim 10, wherein a width of the first curved portion is larger than a width of the first linear portion.

12. The semiconductor device of claim 10, wherein the bit line further comprises a first protruding portion, and wherein the first curved portion connected to the first protruding portion, and the contact plug is connected to the first protruding portion.

13. The semiconductor device of claim 12, wherein the first protruding portion extends from the first curved portion toward the peripheral region.

14. The semiconductor device of claim 12, wherein the bit line further comprises a second curved portion, a second intervening portion connected to the second curved portion, and a second linear portion connected to the second intervening portion, and the first insulating structure is interposed between the first intervening portion and the second linear portion.

15. The semiconductor device of claim 14, further comprising:

a second insulating structure connected to the first linear portion and the second intervening portion.

16. The semiconductor device of claim 12, wherein the first protruding portion overlaps with the cell block region.

17. The semiconductor device of claim 12, wherein a width of the first protruding portion is smaller than a width of the first curved portion of the bit line.

18. The semiconductor device of claim 12, wherein a bottom surface of the contact plug is below a top surface of the first insulating structure.

19. A semiconductor device, comprising:

a substrate including a cell block region and a peripheral region, which are adjacent to each other in a first direction;

an active pattern on the cell block region; a bit line on the active pattern and extending in the first direction;

an insulating structure in contact with the bit line;

a contact plug electrically connected to the bit line;

an outer spacer on an outer side surface of the bit line; and an inner spacer on an inner side surface of the bit line, wherein a top surface of the bit line is coplanar with a top surface of the insulating structure, wherein, as seen in plan view, the bit line comprises a first curved portion, a first linear portion connected to a side of the first curved portion, and a first intervening portion having a first end connected to the side of the first curved portion and a second end connected to an end of the insulating structure, and the insulating structure is interposed between the outer spacer and the inner spacer.

20. The semiconductor device of claim 19, wherein the contact plug is connected to the first curved portion.

* * * * *